(12) United States Patent
Adamovich et al.

(10) Patent No.: US 8,330,351 B2
(45) Date of Patent: Dec. 11, 2012

(54) MULTIPLE DOPANT EMISSIVE LAYER OLEDS

(75) Inventors: Vadim Adamovich, Lawrenceville, NJ (US); Michael S. Weaver, Princeton, NJ (US); Min-Hao Michael Lu, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 358 days.

(21) Appl. No.: 12/225,318

(22) PCT Filed: Apr. 19, 2007

(86) PCT No.: PCT/US2007/009940
§ 371 (c)(1),
(2), (4) Date: Jun. 10, 2010

(87) PCT Pub. No.: WO2007/124172
PCT Pub. Date: Nov. 1, 2007

(65) Prior Publication Data
US 2010/0244725 A1 Sep. 30, 2010

Related U.S. Application Data

(63) Continuation-in-part of application No. 11/408,538, filed on Apr. 20, 2006, now abandoned.

(51) Int. Cl.
*H01L 51/54* (2006.01)
(52) U.S. Cl. ........ 313/504; 313/506; 428/690; 257/102; 438/45
(58) Field of Classification Search .................. 313/504, 313/506; 428/690; 257/102; 438/45
See application file for complete search history.

(56) References Cited

U.S. PATENT DOCUMENTS

| | | | |
|---|---|---|---|
| 4,769,292 | A | 9/1988 | Tang |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,310,360 | B1 | 10/2001 | Forrest |
| 6,468,819 | B1 | 10/2002 | Kim |
| 6,515,298 | B2 | 2/2003 | Forrest |
| 6,548,956 | B2 | 4/2003 | Forrest |
| 6,576,134 | B1 | 6/2003 | Agner |
| 6,893,743 | B2 | 5/2005 | Sato |

(Continued)

FOREIGN PATENT DOCUMENTS
DE     103 41 756     4/2004
(Continued)

OTHER PUBLICATIONS

PCT International Search Report and Written Opinion mailed on Oct. 30, 2007 for PCT/US2007/009949.

(Continued)

*Primary Examiner* — Mary Ellen Bowman
(74) *Attorney, Agent, or Firm* — Kenyon & Kenyon LLP

(57) ABSTRACT

An organic light emitting device comprising, an anode, a cathode, and an emissive layer, located between the anode and the cathode, of a host compound, a first compound capable of phosphorescent emission at room temperature, and a second compound capable of phosphorescent emission at room temperature is provided. At least 95 percent of emission from the device is produced from the second compound when an appropriate voltage is applied across the anode and cathode.

26 Claims, 26 Drawing Sheets

U.S. PATENT DOCUMENTS

| | | |
|---|---|---|
| 7,071,615 B2 | 7/2006 | Lu et al. |
| 7,374,828 B2 | 5/2008 | Kondakova et al. |
| 7,466,073 B2 | 12/2008 | Kishino et al. |
| 2002/0034656 A1 | 3/2002 | Thompson et al. |
| 2002/0182441 A1 | 12/2002 | Lamansky et al. |
| 2003/0072964 A1 | 4/2003 | Kwong et al. |
| 2003/0218418 A9 | 11/2003 | Sato et al. |
| 2003/0230980 A1 | 12/2003 | Forrest et al. |
| 2004/0127710 A1 | 7/2004 | Park et al. |
| 2004/0178720 A1 | 9/2004 | Lee et al. |

FOREIGN PATENT DOCUMENTS

| | | |
|---|---|---|
| WO | 02/074015 | 9/2002 |

OTHER PUBLICATIONS

Baldo et al., "Highly Efficient Phosphorescent Emission from Organic Electroluminescent Devices", Nature 395:151-154, 1998.

Baldo et al., "Very high efficiency green organic light-emitting devices based on electrophosphorescence," Appl. Phys.Lett. 75(3):4-6, 1999.

D'Andrade et al., Efficient Organic Electrophosphorescent White Light Emitting Device with a Triple Doped Emissive Layer, Advanced Materials, 16(7):624-628, 2004.

D'Andrade et al., High Efficiency Yellow Double-Dopes Organic Light Emitting Devices Based on Phosphor-Sensitized Fluorescence, Appl. Phys. Lett 79:1045-7, 2001.

D'Andrade et al., "Controlling Exciton Diffusion in Multilayer White Phosphorescent Organic Light Emitting Devices", Advanced Materials, Oct. 15, 2001, 147-151.

Feng et al., Proceedings of SPIE—The International Society of Optical Engineering, 4105, 30-36, 2001.

Kawamura et al., "Energy Transfer in polymer electrophosphorescent light emitting devices with single and multiple doped luminescent layers", Journal of App. Phys 92, 1, pp. 87-93, 2002.

Green-2

Red-3

BAlq

Alq₃

HIL-1

CBP

US 8,330,351 B2

MULTIPLE DOPANT EMISSIVE LAYER OLEDS

This Application is a national stage entry of International Application PCT/US2007/009940 filed Apr. 19, 2007, which is a continuation in part of U.S. application Ser. No. 11/408,538. The entire contents of all of the above applications are hereby incorporated by reference.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to multiple-doped OLEDs, having emissive layers, comprising at least two dopants, where each dopant is capable of phosphorescent emission at room temperature, and emission from the device is that of only one of the phosphorescent compounds.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer (EML) emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may comprise a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level. U.S. Pat. No. 6,893,743 discloses an OLED, comprising a substrate and a light-emitting layer sandwiched between an anode and a cathode on the substrate. The light-emitting layer comprises at least a host material, having electron-transporting or hole-transporting properties, a compound A, capable of phosphorescent emission at room temperature, and a compound B, capable of phosphorescent emission of fluorescence emission at room temperature, and having a maximum light emission wavelength longer than the maximum light emission of compound A. The maximum light emission of the OLED is attributable to compound B, and the light emission attributable to compound B is intensified by compound A to elevate the light emission efficiency. Where compound B is a fluorescent compound, aging deterioration of the OLED can reportedly be prevented. However, the patent does not disclose an OLED in which all or substantially all of the emission of the OLED is produced by compound B.

U.S. Pat. No. 6,515,298 discloses OLEDs, comprising intersystem crossing agents. In one disclosed embodiment, the fluorescent efficiency of a fluorescent emitter is enhanced by combining the fluorescent emitter with a phosphorescent sensitizer, where the phosphorescent sensitizer operates as an intersystem crossing agent. In a second disclosed embodiment, the phosphorescent efficiency of a phosphorescent emitter is enhanced by combining the phosphorescent emitter with a host and intersystem crossing agent, where both the host and agent both have singlet spin multiplicity. In a third disclosed embodiment, a thin layer of ISC agent is placed between the HTL and ETL of the OLED, where the ISC agent has an optical absorption spectrum that strongly overlaps the emission line of the material found at the site of recombination. Enhancement of the efficiency of a phosphorescent material is not disclosed.

D'Andrade et al., High Efficiency Yellow Double-Doped Organic Light-Emitting Devices Based on Phosphor-Sensitized Fluorescence, Applied Physics Letters 79 (2001) pp 1045-1047 discloses high-efficiency fluorescent OLEDs utilizing a phosphorescent sensitizer. Double doping of fluorescent red (DCM) and phosphorescent green (Irppy) sensitized the fluorescent red emission by the phosphorescent green emitter, enhancing the fluorescent red OLED efficiency.

Feng, et al., Proceedings of SPIE—The International Society of Optical Engineering, 4105 (2001) pp 30-36 disclose double-doped fluorescent red and blue emitters for the generation of white (a mixture of colors) emission.

Kawamura et al., Journal of Applied Physics, 92, 1, (2002) pp 87-93, disclose white devices utilizing three blue, yellow, and red phosphorescent emitters in a polymer PKK host.

D'Andrade et al., Electrophosphorescent White-Light Emitting Device with a Triple Doped Emissive Layer, Advanced Materials, 16, 7, (2004) pp 624-628, and Controlling Exciton Diffusion in Multilayer White Phosphorescent Organic Light Emitting Devices, Advanced Materials, 14, 2, (2002) pp 147-151, disclose mixtures of two or three phosphorescent emitters in a vacuum deposited OLED in which all of the deposited emitters contribute to the device white emission.

SUMMARY OF THE INVENTION

The invention is directed to organic light emitting devices, comprising an anode, a cathode, and an emissive layer, where the emissive layer is located between the anode and the cathode. The emissive layer comprises a host compound, a first compound capable of phosphorescent emission at room temperature, and a second compound capable of phosphorescent emission at room temperature. In devices in accordance with the invention, there is at least one voltage at which at least 95 percent of emission from the device is produced from the second compound with a luminance of at least 10 $cd/m^2$, when the at least one voltage is applied across the anode and cathode. Preferably, the first compound is a charge carrying compound, and can be either an electron carrying compound or a hole carrying compound. Preferably, the device has a CIE, i.e., CIE coordinates, that is substantially the same as that of a second device, where the second device differs from the device of the invention only in that the second device has an emissive layer that does not contain the first compound. The emissive layers of the organic light emitting devices of the invention are preferably formed by vapor deposition or solution deposition techniques.

The external quantum efficiency of the device is preferably greater than that of a second device, where the second device differs from the device only in that the second device has an emissive layer that does not contain the first compound. The second device can have a doping percentage of the second compound equivalent to that of the second compound of the device. Similarly, the device preferably has a lifetime greater than that of a second device, where the second device differs from the device only in that the second device has an emissive layer that does not contain the first compound. More preferably, the lifetime of the device is at least 3 times that of the second device, and, for certain preferred devices in accordance with the invention, is from about 3 to about 4 times that of the second device.

The first and second compounds may be present in the emissive layer in any useful amounts. Preferably, the first compound is present in an amount of from about 3.5 to about 40 mole percent and, more preferably, about 15 mole percent based on the emissive layer. The second compound is preferably present in an amount of from about 3 to about 20 mole percent and, more preferably, in an amount of about 4.5 mole percent, based on the emissive layer.

Preferably, at least about 99 percent of emission from the device is produced from the second compound when a voltage is applied across the anode and cathode. More preferably, substantially all of the emission from the device is produced from the second compound when the voltage is applied across the anode and cathode.

Preferred devices include red-green devices, where the first compound is a green phosphorescent compound, and the second compound emits a red phosphorescent emission. Preferably, at least one of the first and second compounds is an organometallic compound. OLEDs in accordance with the invention include devices in which the first compound is Green-1, Iridium(III)tris[2-(biphenyl-3-yl)-4-tert-butylpyridine], and the second compound is Red-1, Bis[5-Phenyl-3'-methyl(2-phenylquinoline)]iridium(III) acetylacetonate, and, more preferably, the emissive layer is deposited by a solution process, such as spin-coating. OLEDs in accordance with the invention include devices in which the first compound is preferably Green-2, Iridium(III)tris(3-methyl-2-phenylpyridine), and the second compound is preferably Red-2, Bis[3'-methyl(2-phenylquinoline)]iridium(III) acetylacetonate. OLEDs in accordance with the invention include devices in which the first compound is preferably Green-2 and the second compound is preferably Red-3, bis(1-phenylisoquinoline) iridium III acetylacetonate. Other phosphorescent compounds that emit colors other than red and green can be used in the invention. For example, dual-doped OLEDs, comprising a blue phosphorescent compound as the first compound are also within the scope of the present invention.

OLEDs in accordance with the invention include an organic light emitting device comprising an anode, a cathode, and an emissive layer, where the emissive layer is located between the anode and the cathode, and the emissive layer comprises a host compound, a first compound capable of phosphorescent emission at room temperature, and a second compound capable of phosphorescent emission at room temperature. There is at least one voltage at which the device has a CIE that is substantially the same as that of a second device, when the least one voltage is applied across the anode and the cathode, wherein the second device differs from the device only in that the second device has an emissive layer that does not contain the first compound.

OLEDs in accordance with the invention include an organic light emitting device comprising an anode, a cathode, and an emissive layer, where the emissive layer is located between the anode and the cathode. The emissive layer comprises a host compound, a first compound capable of phosphorescent emission at room temperature, and a second compound capable of phosphorescent emission at room temperature. At least 95 percent of emission from the device is produced from the second compound over the normal luminance range of the device.

OLEDs in accordance with the invention include an organic light emitting device comprising an anode, a cathode, and an emissive layer, where the emissive layer is located between the anode and the cathode, and the emissive layer comprises a host compound, a first compound capable of phosphorescent emission at room temperature, and a second compound capable of phosphorescent emission at room temperature. The device has a CIE that is substantially the same over the normal luminance range of the device as that of a second device, wherein the second device differs from the device only in that the second device has an emissive layer that does not contain the first compound.

The invention is also directed to a method for producing light emission from an organic light emitting device. The method comprises obtaining an organic light emitting device in accordance with the invention, and applying a voltage across the anode and the cathode of the device, where the voltage is sufficient to produce emission from the device with a luminance of at least 10 cd/m$^2$, and where at least 95 percent of the emission is produced from the second compound.

Methods in accordance with the invention include a method for producing light emission from an organic light emitting device. The method comprises obtaining an organic light emitting device in accordance with the invention, and applying a voltage across the anode and the cathode sufficient to produce emission from the device, wherein the device emission has a CIE that is substantially the same as that of a second device that differs from the device only in that the second device has an emissive layer that does not contain the first compound.

In OLEDs in accordance with the invention, the triplet energy of the non-emissive dopant is greater than or equal to the triplet energy of the emissive dopant. Preferably, the non-emissive dopant has a HOMO level between the HOMO level of the host and the HOMO level of the emissive dopant, and, preferably, the non-emissive dopant has a LUMO level between the LUMO level of the host and the LUMO level of the emissive dopant. As used herein, the term "non-emissive dopant" refers to a dopant that produces no more than the 5 percent of the total emission of the device, and, preferably, produces substantially no emission.

DETAILED DESCRIPTION

Figure 1:
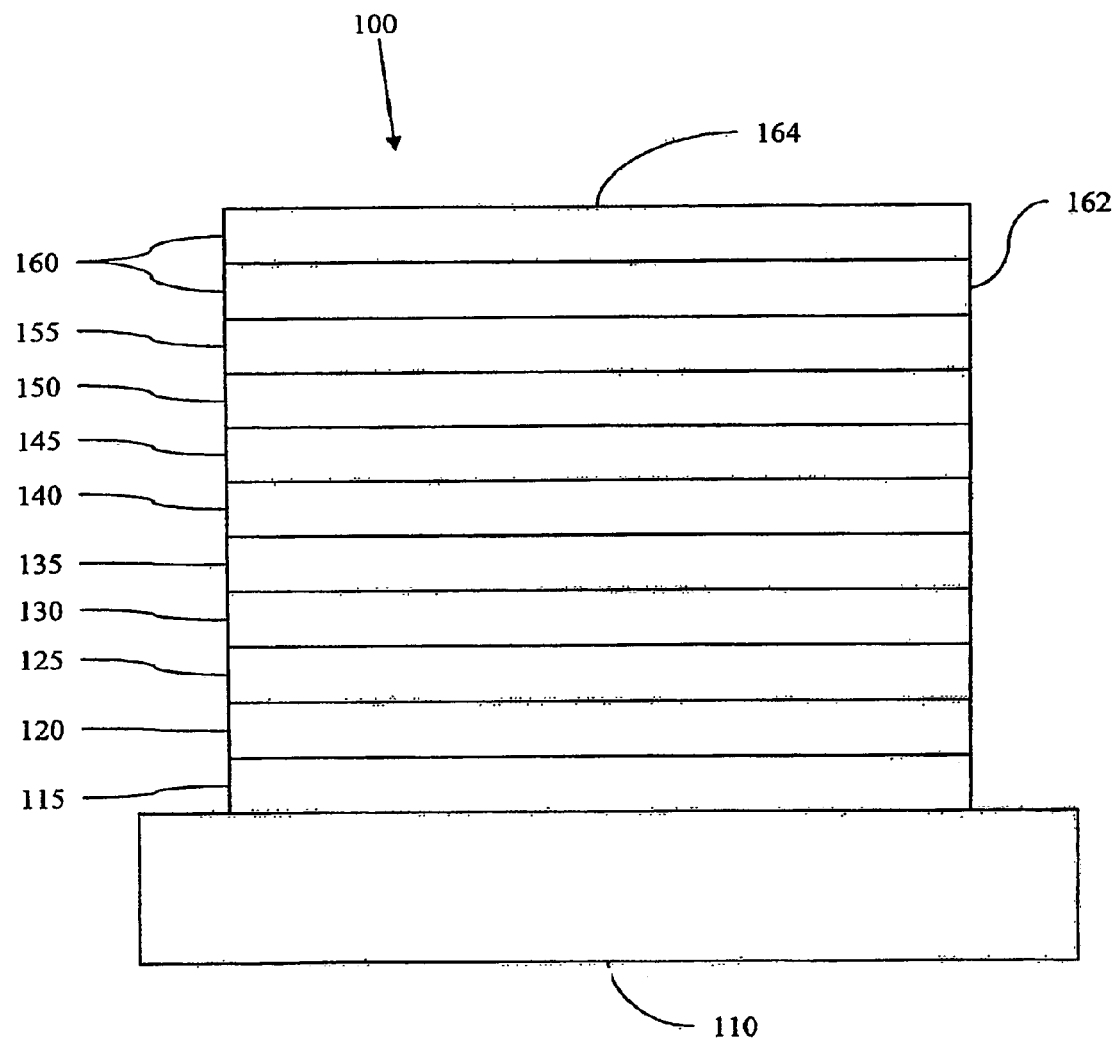
FIG. 1 illustrates an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140; an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent, or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-02309890 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP, and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer, or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-02309890 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers comprise a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931, 948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
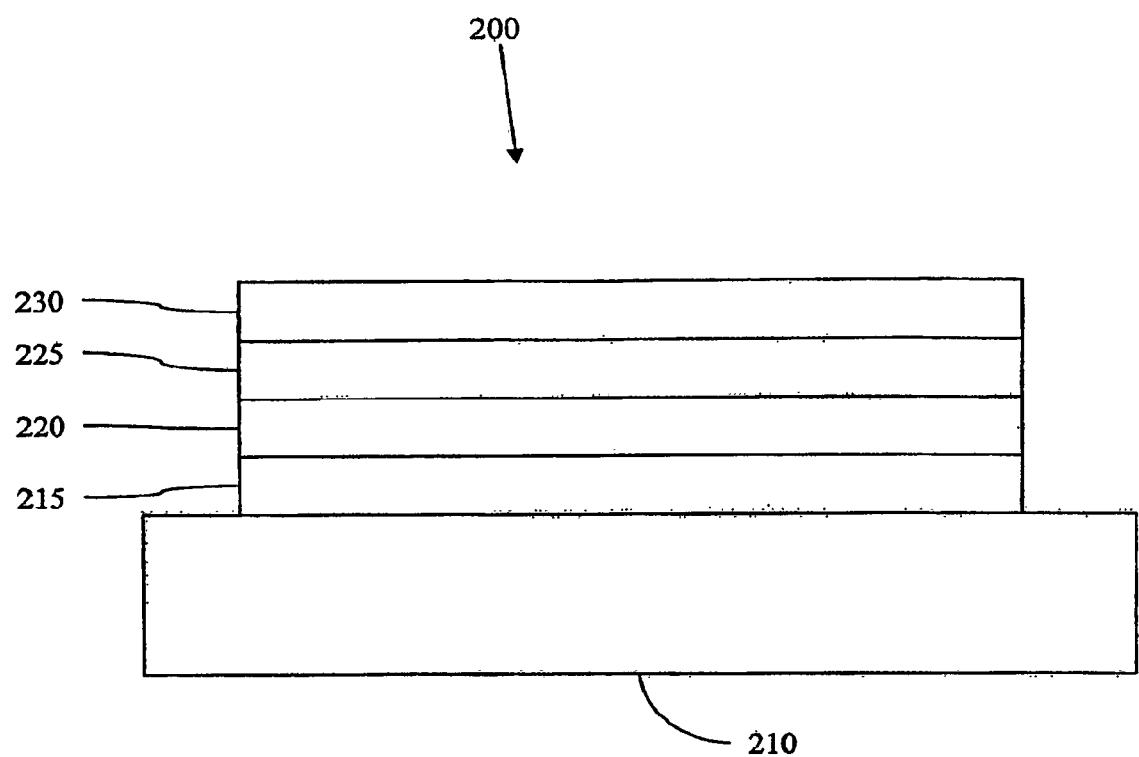
FIG. 2 illustrates an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprising polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, Which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (about 20° to about 25° C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Preferably, OLEDs in accordance with the invention are multiple-doped OLEDs. In multiple-doped OLEDs, at least one additional charge transporting dopant, preferably a phosphorescent dopant, is included in the emissive layer of a phosphorescent OLED (PHOLED), forming an emissive layer having at least two phosphorescent dopants. It will be understood by those skilled in the are that the invention is not limited to two dopants, such that more than two dopants may be used in the device emissive layer. The use of two or more phosphorescent dopants significantly improves the performance of the device, including the device luminous efficiency, stability, and lifetime. In particular, the device lifetime is typically enhanced, compared to that of a corresponding single-doped device, doped with only one phosphorescent dopant, that emits at the same or similar wavelength, such that the lifetime is preferably at least 3 times that of the single-doped device, and, more preferably, the lifetime is increased by a factor of at least about 3 to about 4. As used herein, a "corresponding single-doped device" is an OLED, having an emissive layer comprising only a single phosphorescent dopant that is the same as the emissive dopant in a multiple-doped device.

In such multiple-doped devices in accordance with the invention, the CIE coordinates of the emission of the device are preferably substantially the same as those of the emission of a single-doped device having an emissive layer comprising only one of the dopants used in the device of the invention. That is, the emission of the device is substantially the same as if the dopant present in both the single-doped device and the multiple-doped device is emissive, and the at least one additional dopant is preferably non-emissive. Preferably, the emission of the multiple-doped devices of the invention is that of the dopant having the lowest energy emission, i.e., the dopant having the emission with the longest wavelength.

Multiple-doped devices in accordance with the invention can be prepared by vapor thermal evaporation (VTE) and solution deposition processes. Any useful amount of each of the dopants may be used in multiple-doped OLEDs of the invention. Preferably, the first compound is present in an amount of from about 3.5 to about 40 mole percent, and, more preferably, about 15 mole percent, based upon the emissive layer. Preferably, the second compound is present in an amount of from about 3 to about 20 mole percent, and, more preferably, about 4.5 mole percent, based upon the emissive layer.

The amount of emissive dopant may be maintained at about the level found in a corresponding single-doped device, such that the addition of the at least one additional dopant increase the total amount of dopant in the emissive layer of the device.

In certain preferred devices in accordance with the invention, the amount of the emissive dopant is about the same as that of a corresponding single-doped device. Preferably, the ratio of the amount of the non-emissive dopant to that of the emissive dopant is from about 1:1 to about 8:1.

Multiple-doped phosphorescent OLEDs, having improved performance compared to single-doped devices, can also be fabricated with a maximum total amount of dopants that is more than about that of the amount of the emissive dopant in a corresponding single-doped device. In certain preferred devices in accordance with the invention, comprising two phosphorescent dopants, the amount of each dopant is about 50 to 500 mole percent of the amount of dopant in a corresponding single-doped device.

A typical OLED has a "normal luminance range" over which the CIE characteristics of the device do not change significantly. Preferably, the x and y CIE coordinates do not vary by more than 0.04 CIE units, more preferably, by more than 0.03 CIE units, and, most preferably, by more than 0.02 CIE units over the normal luminance range. For an active matrix OLED (AMOLED), the luminance range is preferably from 10 to 5,000 $cd/m^2$. For a passive matrix OLED (PMOLED) the peak luminance range is preferably from 10 to 150,000 $cd/m^2$. For lighting applications, the luminance range is preferably from 10 to 10,000 $cd/m^2$. Varying the voltage applied to a device changes the intensity of the light emitted, and, for any given device, there is a range of voltages that, when applied to the device, provide the normal luminance range. For a given device, the voltage range that provides the normal luminance range may be referred to as the "normal operating voltage range" of the device.

As one of skill in the art would understand, it may be possible to obtain emission having a CIE that differs from that emitted over the normal luminance range. Without being bound by theory, this may occur because an exciton on a phosphorescent emissive molecule has a finite lifetime. As a result, there is a maximum rate at which a given number of phosphorescent molecules produce photons from excitons. If a voltage is applied to a device that is greater than that required to provide emission within the normal luminance range of the device, the rate at which excitons are generated may exceed the rate at which the phosphorescent molecules in the device can produce photons from excitons. As a result, the excess excitons may find other emissive pathways from other molecules in the device that do not have the characteristic CIE coordinates of the intended emissive molecule. When this unwanted emission occurs to a significant degree, the CIE coordinates of the light emitted by the device may vary as a function the luminance and/or the voltage. However, in devices in accordance with the invention, there is a voltage range, such that, when a voltage within that range is applied to the device, the device emits light having the desired CIE coordinates with a luminance within the normal luminance range.

Devices in accordance with the invention have emissive layers comprising first and second compounds that are capable of phosphorescent emission at room temperature. Over the normal luminance range of the devices of the invention, most if not all of the emission is produced from only the second compound. Without being bound by theory that would limit the scope of the invention, it is believed that the first compound, without emitting a significant amount of light, affects the charge transport, charge trapping, exciton formation, and/or interaction of excitons with the charged species in the emissive layer. Preferably, at least 95 percent of the emission from the device is produced from the second dopant over the normal luminance range. That is, in preferred devices in accordance with the invention, there is at least one voltage at which at least 95 percent of emission from the device is produced from the second compound with a luminance of at least 10 $cd/m^2$.

Multiple-doped phosphorescent OLEDs in accordance with the invention, having improved performance compared to single-doped devices, can also be fabricated with a maximum total amount of dopants that is greater than that of the amount of the emissive dopant in a corresponding single-doped device, where emissive dopant is present in an amount less than that present in a corresponding single-doped device.

Particularly preferred devices of the invention include dual-doped red-green devices, having a significantly longer lifetime than single doped red devices. Such devices preferably have an emission spectrum that is substantially the same as that of a corresponding single doped device, such that the CIE coordinates of the dual-doped red-green device is substantially the same as those of the single-doped red device. Typically, the color emitted by the device is that of the emissive dopant having the lower energy emission, and, thus, the peak of the emission spectrum has a longer wavelength than that of the non-emissive dopant, such that the emission of the dual-doped red-green devices is red. More preferably, the spectrum of the dual-doped red-green device is substantially the same as that of a corresponding single-doped device. Note, in some instances, there will be minor differences in the emission of the dual-doped device compared to a single-doped device due to a difference in the recombination zone and/or dipole moment of the emissive layer that results from the presence of the non-emissive dopant. The lifetime and stability of multiple-doped devices, prepared by solution deposition and VTE processes, is generally improved, preferably by at least about 50 percent, compared to single-doped devices, without any impact on the initial performance of the device. Preferably, in the preferred red-green devices, the lifetime and stability can be improved by a factor of at least about 3 and, more preferably, at least about 3 to about 4, compared to single-doped red devices, without any impact on the initial performance of the device.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:
As used herein, abbreviations refer to materials as follows:
CBP: 4,4'-N,N-dicarbazole-biphenyl
m-MTDATA: 4,4',4"-tris(3-methylphenylphenlyamino) triphenylamine
$Alq_3$: 8-tris-hydroxyquinoline aluminum
Bphen: 4,7-diphenyl-1,10-phenanthroline
n-BPhen: n-doped BPhen (doped with lithium)
$F_4$-TCNO: tetrafluoro-tetracyano-quinodimethane
p-MTDATA: p-doped m-MTDATA (doped with $F_4$-TCNQ)
$Ir(ppy)_3$: tris(2-phenylpyridine)-iridium
$Ir(ppz)_3$: tris(1-phenylpyrazoloto,N,C(2')iridium(III)
BCP: 2,9-dimethyl-4,7-diphenyl-1,10 phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-hydroxyquinolinato)-4-phenylphenolate
mCP: 1,3-N,N-dicarbazole-benzene DCM: 4-(dicyanoethylene)-6-(4-dimethylaminostyryl-2-methyl)-4H-pyran DMQA: N,N'-dimethylquinacridone PEDOT:PSS: an aqueous dispersion of poly(3,4-ethylenedioxythiophene) with polystyrenesulfonate (PSS)

EXAMPLES

Figure 23:
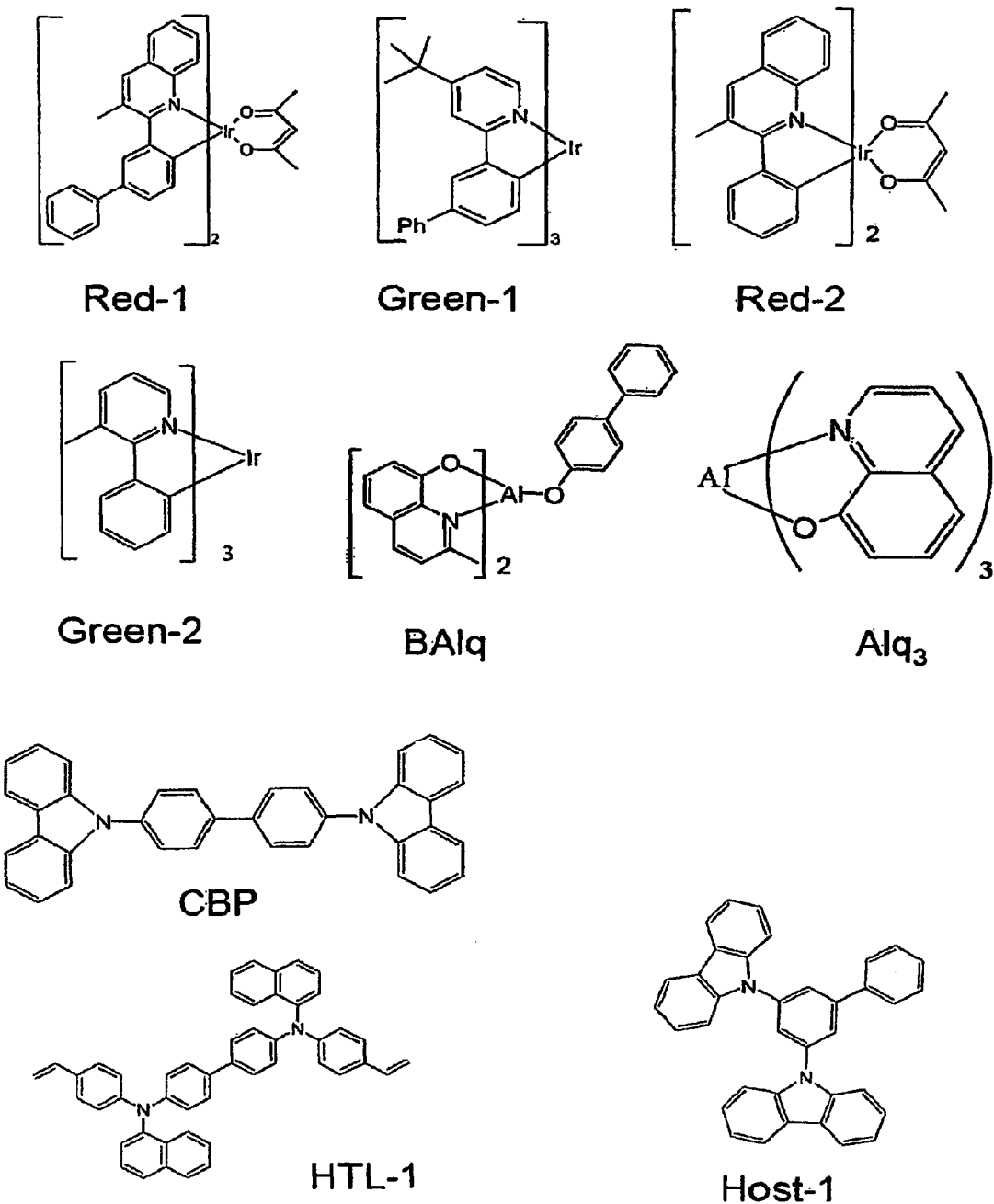
FIG. 23 illustrates the structures of the compounds used in Examples 1, 2, and 3 and in Comparative Examples 1 and 2.
Figure 24:
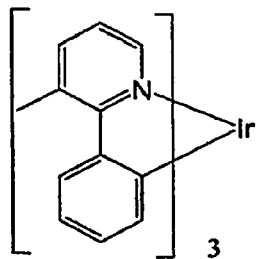
FIG. 24 illustrates the structures of the compounds used in Example 4 and in Comparative Example 3.
Figure 24:
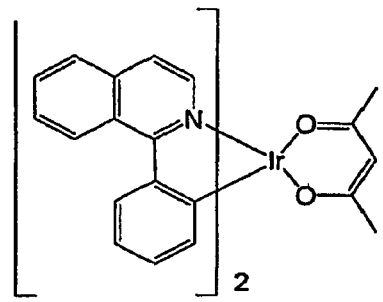
Figure 24:
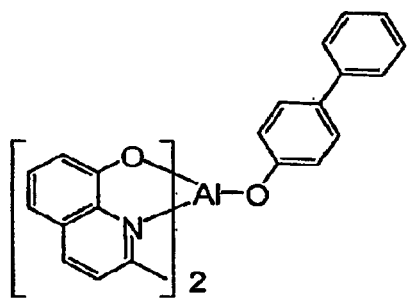
Figure 24:
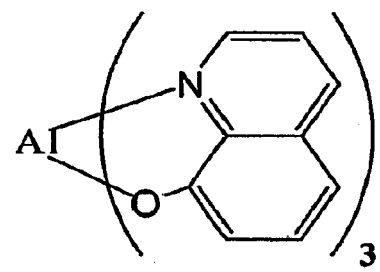
Figure 24:
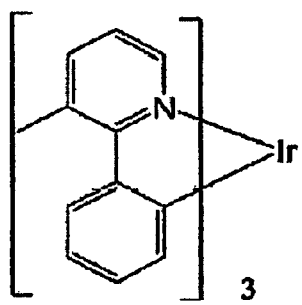
Figure 24:
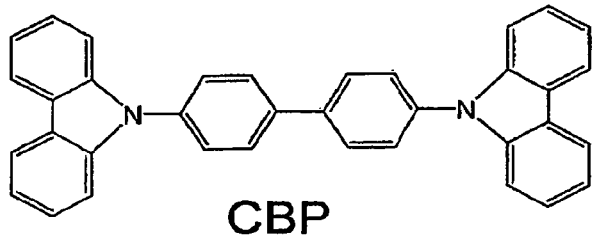
Figure 26:
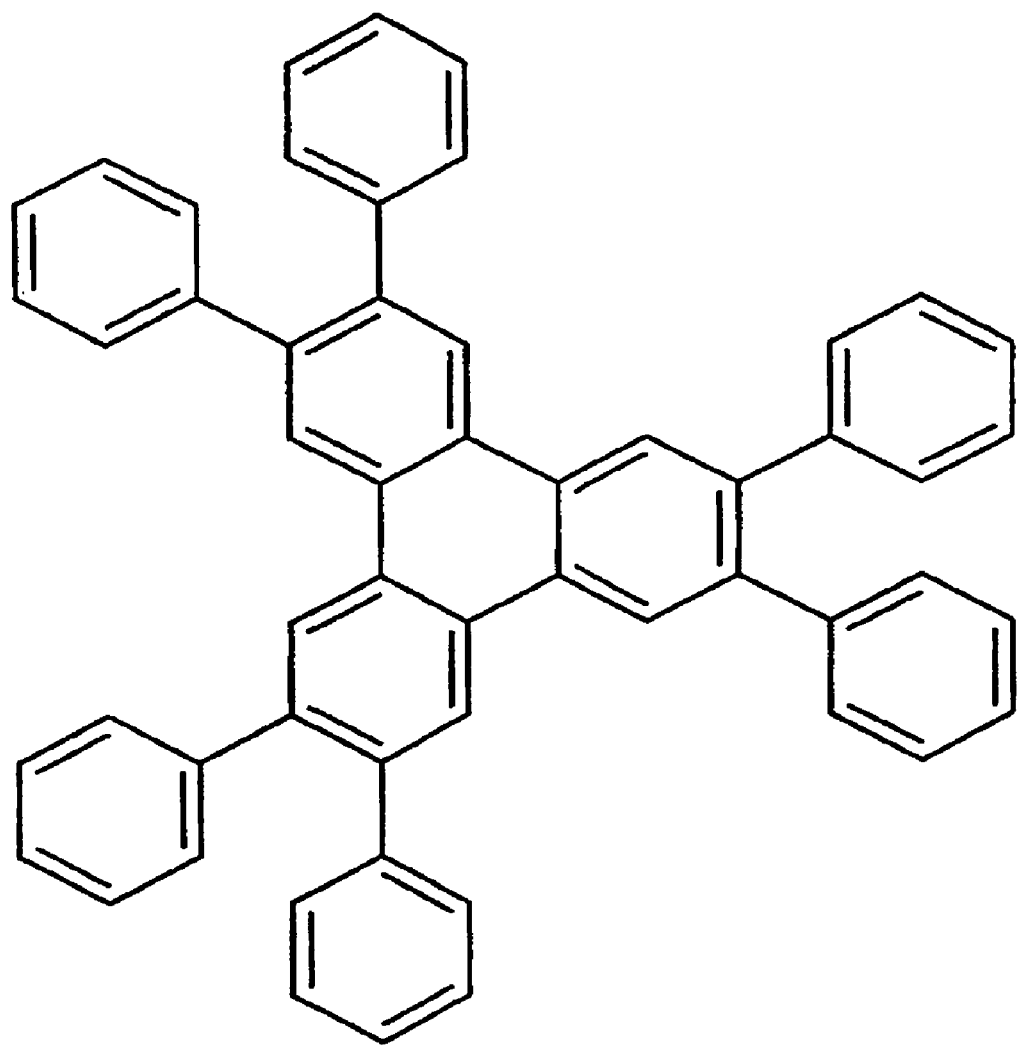
FIG. 26 illustrates the structure of the hexaphenyltriphenylene (HPT) blocking layer material of Examples 5 and 9.

The following non-limiting examples are merely illustrative of the preferred embodiments of the present invention, and are not to be construed 2& limiting the invention, the scope of which is defined by the appended claims. The chemical structures of the compounds used in the exemplified devices are provided in FIGS. 23, 24, and 26. As used herein, and as illustrated in FIGS. 23, 24, and 26, Red-1 is Bis[5'-Phenyl-3-methyl(2-phenylquinoline)]iridium(III) acetylacetonate;

Green-1 is Iridium(III)tris[2-(biphenyl-3-yl)-4-tert-butylpyridine];

Red-2 is Bis[3-methyl(2-phenylquinoline)]iridium(III) acetylacetonate;

Green-2 is Iridium(III)tris(3-methyl-2-phenylpyridine);

Red-3 is bis(1-phenylisoquinoline) iridium III acetylacetonate;

HTL-1 is 4,4'-Di[N-(1-naphthyl-4-styrylamino)]biphenyl;

HIL-1 is Iridium(III)tris(3-methyl-2-phenylpyridine); and

Host-1 is 3,5-di(N-carbazole)biphenyl.

All vapor deposited layers of the Examples and Comparative Examples were deposited by high vacuum ($<10^{-7}$ Torr) thermal evaporation. The anode electrode in all devices was ~1200 Å of indium tin oxide (ITO). The cathodes consist of 10 Å of LiF followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. Operational lifetests were performed at constant direct current at room temperature.

Solution Deposited Devices

Figure 3:
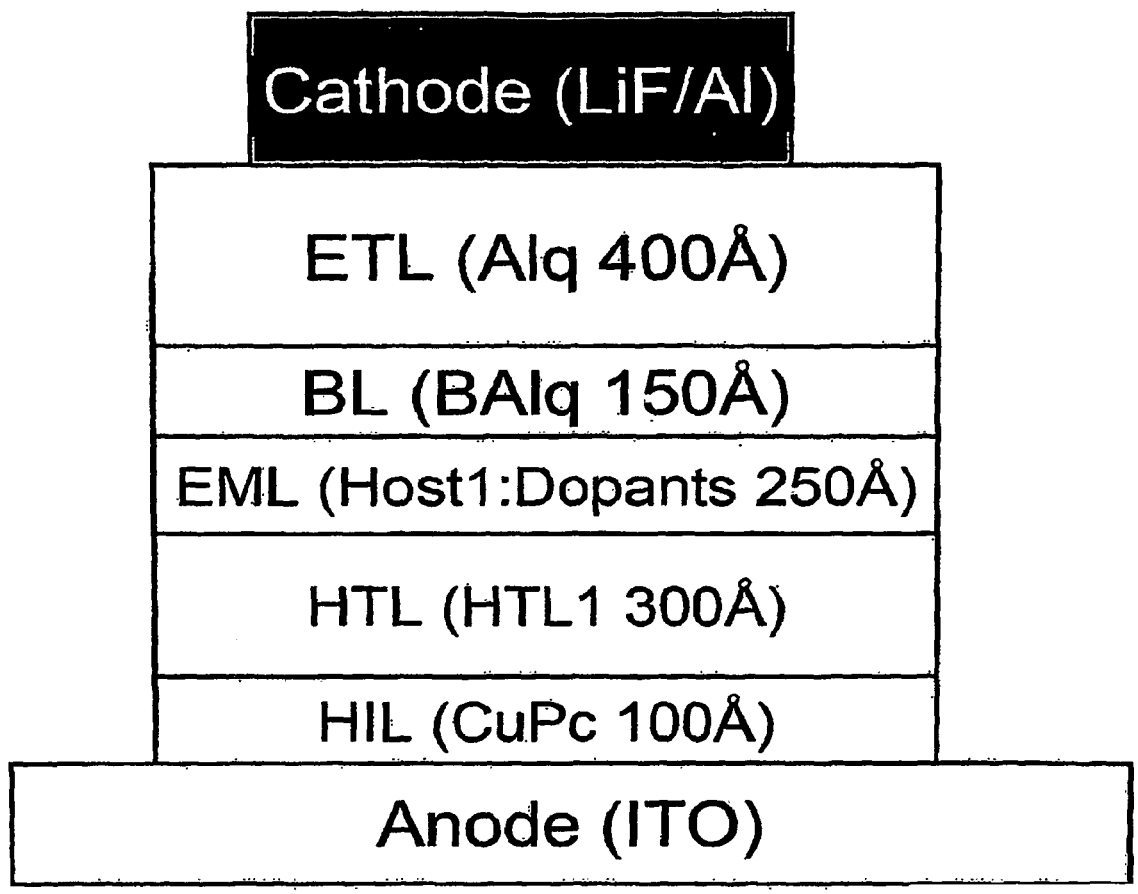
FIG. 3 illustrates the structure of the solution deposited devices of Examples 1 and 2 and Comparative Example 1.

Red emitting, solution deposited multiple-doped OLEDs were prepared using the green phosphorescent dopant Green-1 as a non-emissive dopant and Red-1 as a red phosphorescent dopant with a host of Host-1. For comparison, a corresponding single-doped device was prepared using Red-1, as the emissive dopant in Host-1. The structure of the devices is illustrated in FIG. 3. The specific device structures of the devices of Examples 1 and 2, having double-doped emissive layers, were as follows.

Example 1

ITO/CuPc/HTL-1/Host-1:Green-1:Red-1(88:6:6)/BAlq/Alq/LiF:Al

Example 2

ITO/CuPc/HTL-1/Host-1:Green-1:Red-1(80:10:10)/BAlq/Alq/LiF:Al

The specific device structure of the device of Comparative Example 1, having a single-doped emissive layer, was as follows.

Comparative Example 1

ITO/CuPc/HTL-1/Host-1:Red-1(88:12)/BAlq/Alq/LiF:Al

Each of the devices of Example 1 and 2 and Comparative Example 1 were prepared by spin-coating, as follows:

A 100 Å hole injection layer (HIL) of CuPc was deposited by VTE onto an 1200 Å ITO anode on a substrate;

A hole transport layer (HTL) of HTL-1 was spin coated from a 1 percent toluene solution at 2,000 rpm, and then baked at 200° C. for 30 minutes on a hot plate;

An emissive layer was spin coated from a 0.75 percent toluene solution, and then baked at 100° C. for 60 minutes on a hot plate; and Each partial device was then place in a vacuum chamber where BAlq/Alq/LiF/Al was deposited by thermal evaporation, providing a device having the structure illustrated in FIG. 3:

ITO(1200 Å)/CuPc(100 Å)/HTL-1(300 Å)/Host-1:dopant(s) (250 Å)/Balq(150 Å)/Alq(400 Å)/LiF(10 Å)/Al(1000 Å).

The performance of each of the devices of Examples 1 and 2 and Comparative Example 1 are set forth in Table 1.

TABLE 1

| | Example 1 | Example 2 | Comparative Example 1 |
|---|---|---|---|
| Emissive Red dopant, weight % | Red-1 6% | Red-1 10% | Red-1 12% |
| Non-emissive green dopant, weight % | Green-1 6% | Green-1 6% | — |
| CIE | 0.66, 0.34 | 0.65, 0.34 | 0.67, 0.33 |
| Voltage*, V | 9.1 | 8.5 | 8.6 |
| Luminous Efficiency*, cd/A | 9.3 | 5.4 | 8.4 |
| E.Q.E.*, % | 9.2 | 5.4 | 9.3 |
| Power Efficiency*, lm/W | 3.2 | 2.0 | 3.0 |
| $L_{80\%}$ at $L_o = 500$ cd/m$^2$, h | 160 | 215 | 50 |

*at 100 cd/m$^2$

Figure 4:
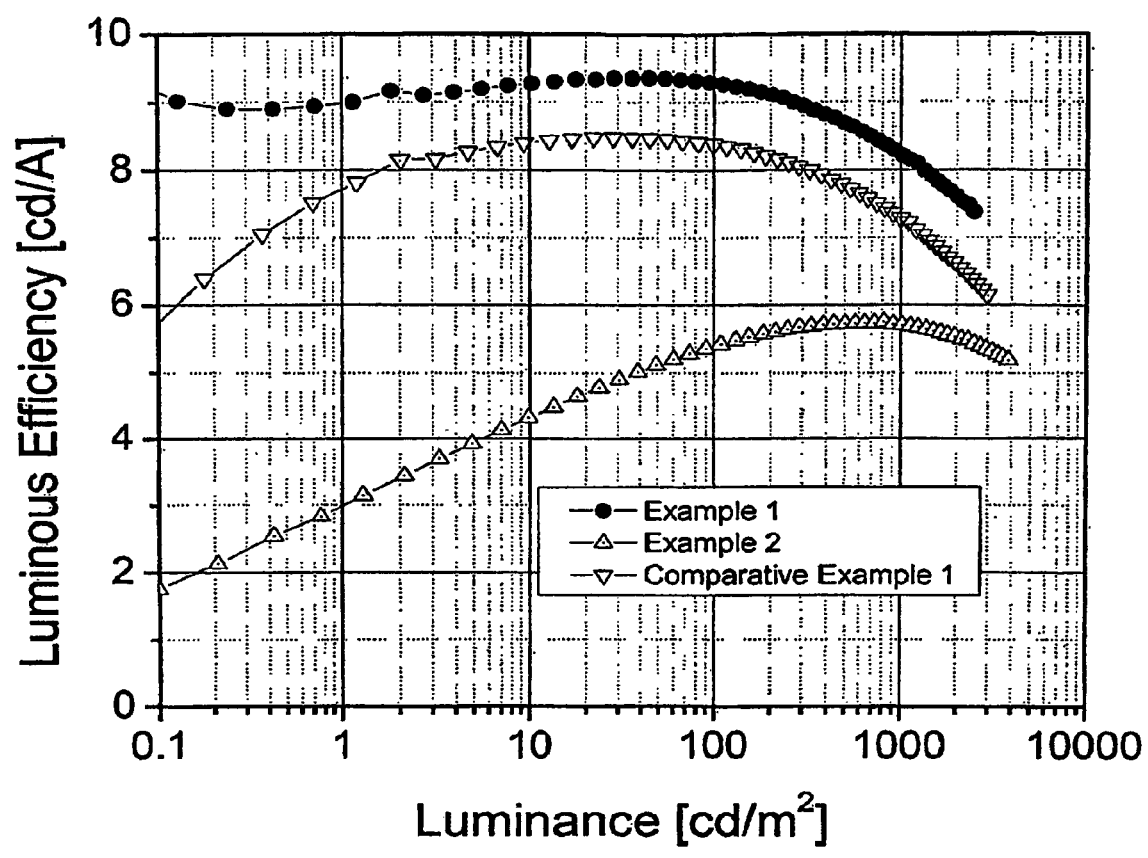
FIG. 4 illustrates a comparison of the luminous efficiency, as a function of luminance, of the devices of Examples 1 and 2 and Comparative Example 1.
Figure 5:
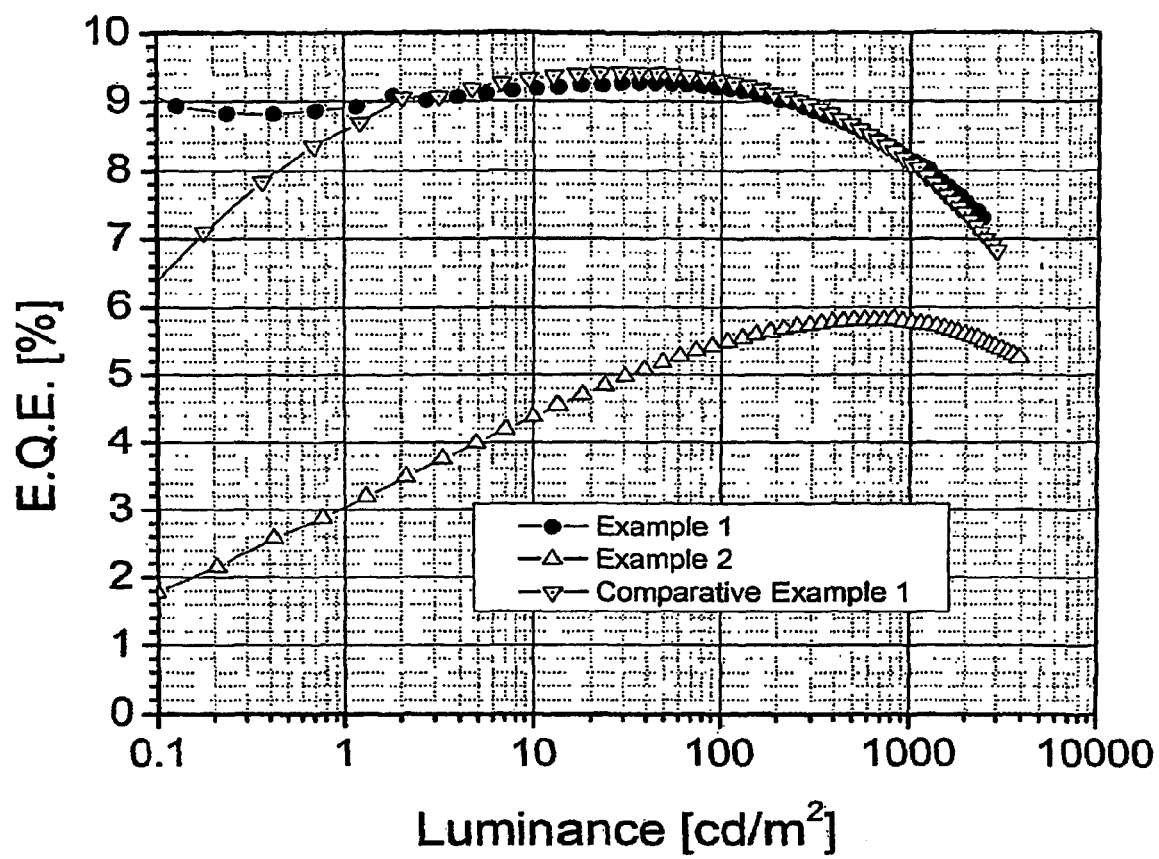
FIG. 5 illustrates a comparison of the external quantum efficiency, as a function of luminance, of the devices of Examples 1 and 2 and Comparative Example 1.
Figure 6:
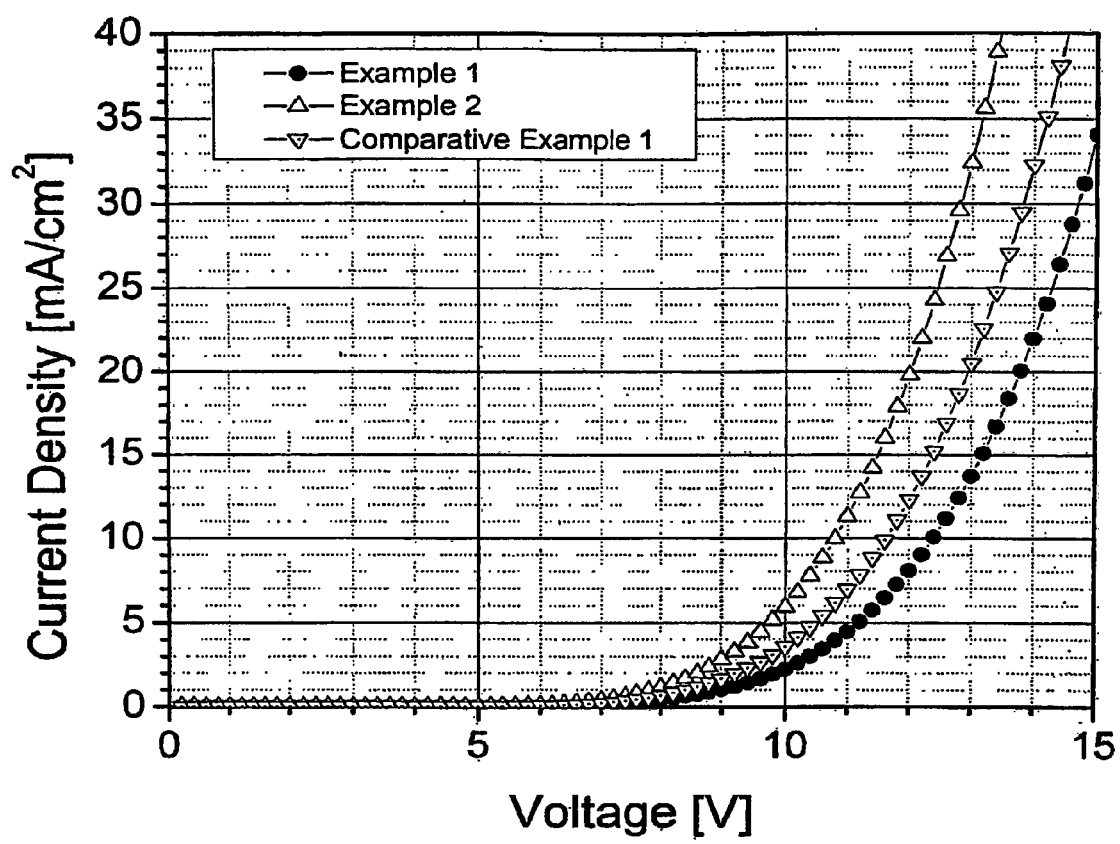
FIG. 6 illustrates a comparison of the current density, as a function of voltage, of the devices of Examples 1 and 2 and Comparative Example 1.
Figure 7:
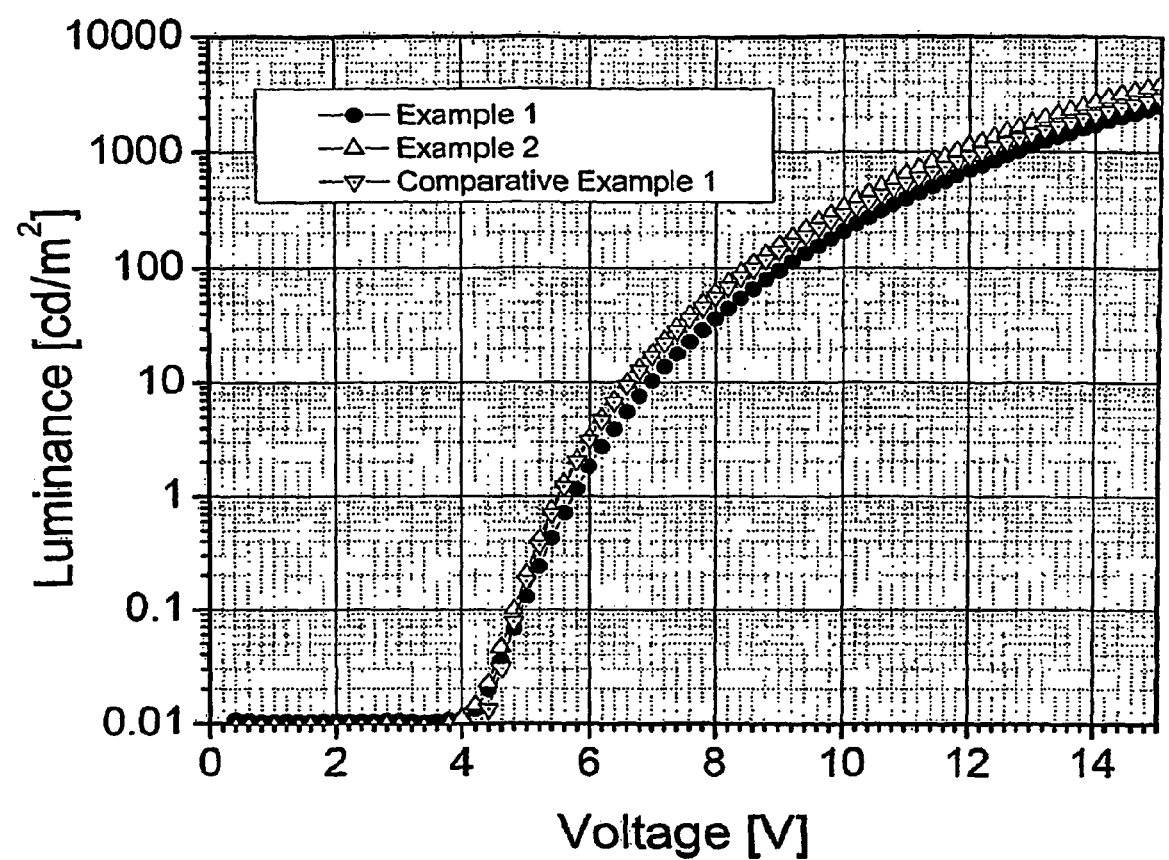
FIG. 7 illustrates a comparison of the luminance, as a function of voltage, of the devices of Examples 1 and 2 and Comparative Example 1.
Figure 9:
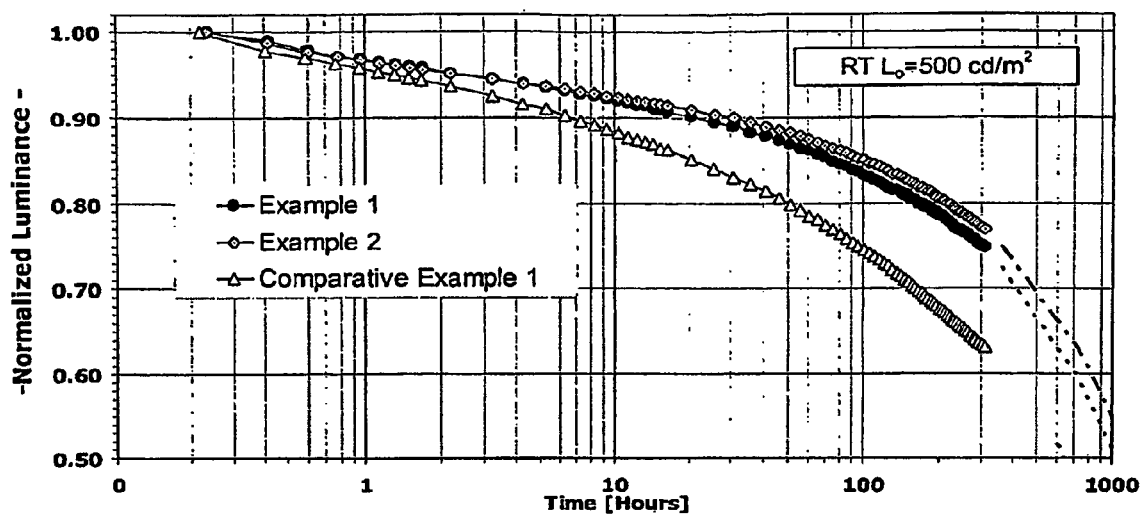
FIG. 9 illustrates a comparison of the lifetimes of the devices of Examples 1 and 2 and Comparative Example 1.

The improved performance of solution processed multiple-doped devices in accordance with the invention is illustrated in FIGS. 4 to 7. FIG. 4 illustrates the luminous efficiency, as a function of luminance, FIG. 5 illustrates the external quantum efficiency, as a function of luminance, FIG. 6 illustrates the current density, as a function of voltage, and FIG. 7 illustrates the luminance, as a function of voltage, for each of the devices of Examples 1 and 2 and Comparative Example 1. The results for the device of Example 2 indicate that there may be an upper limit to the improved performance when the total amount of dopant exceeds a certain value. However, as illustrated in FIG. 9, the lifetimes of the multiple-doped devices of both Example 1 and Example 2 are clearly superior to that of the single-doped device of Comparative Example 1.

Figure 8:
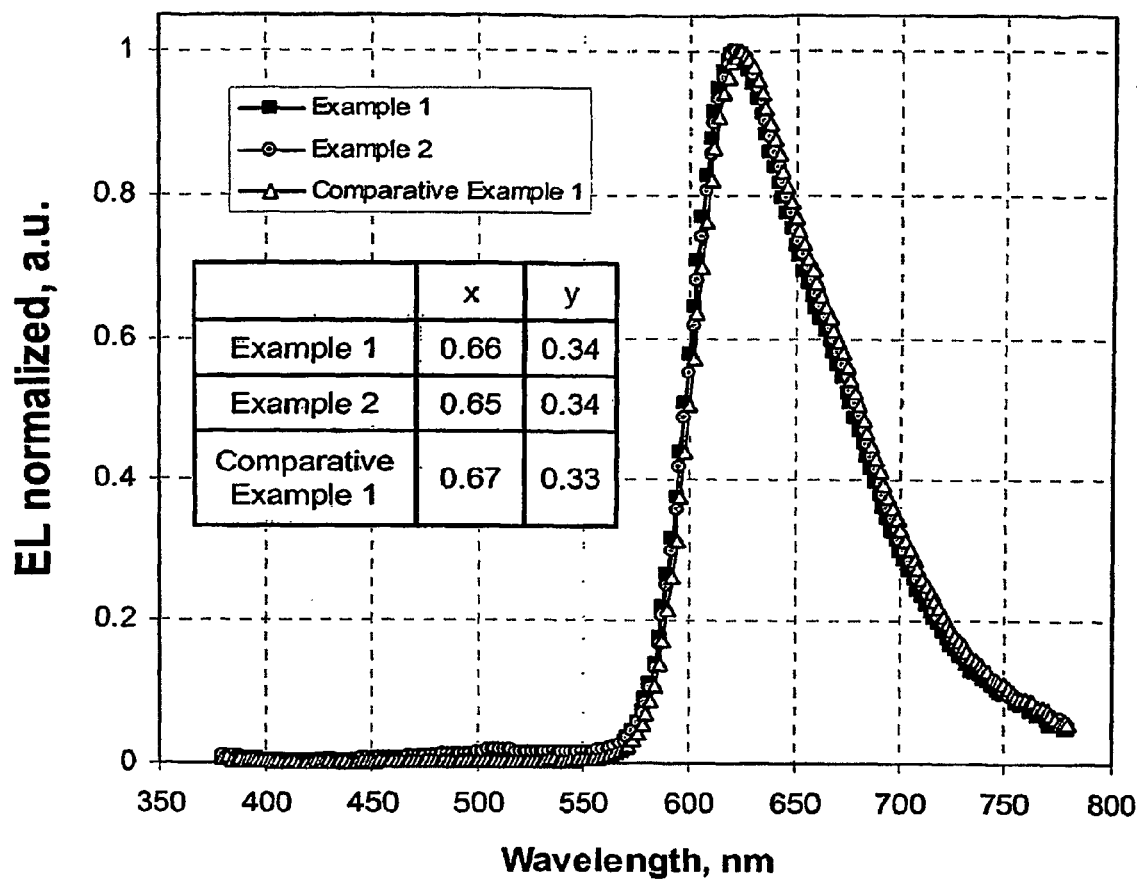
FIG. 8 illustrates a comparison of the electroluminescence spectra of the devices of Examples 1 and 2 and Comparative Example 1.

FIG. 8 clearly demonstrates that the CIE coordinates and, thus, the color of the multiple-doped devices of both Example 1 and Example 2 is substantially the same as those of the single-doped device of Comparative Example 1.

Vapor Deposited Devices

Figure 10:
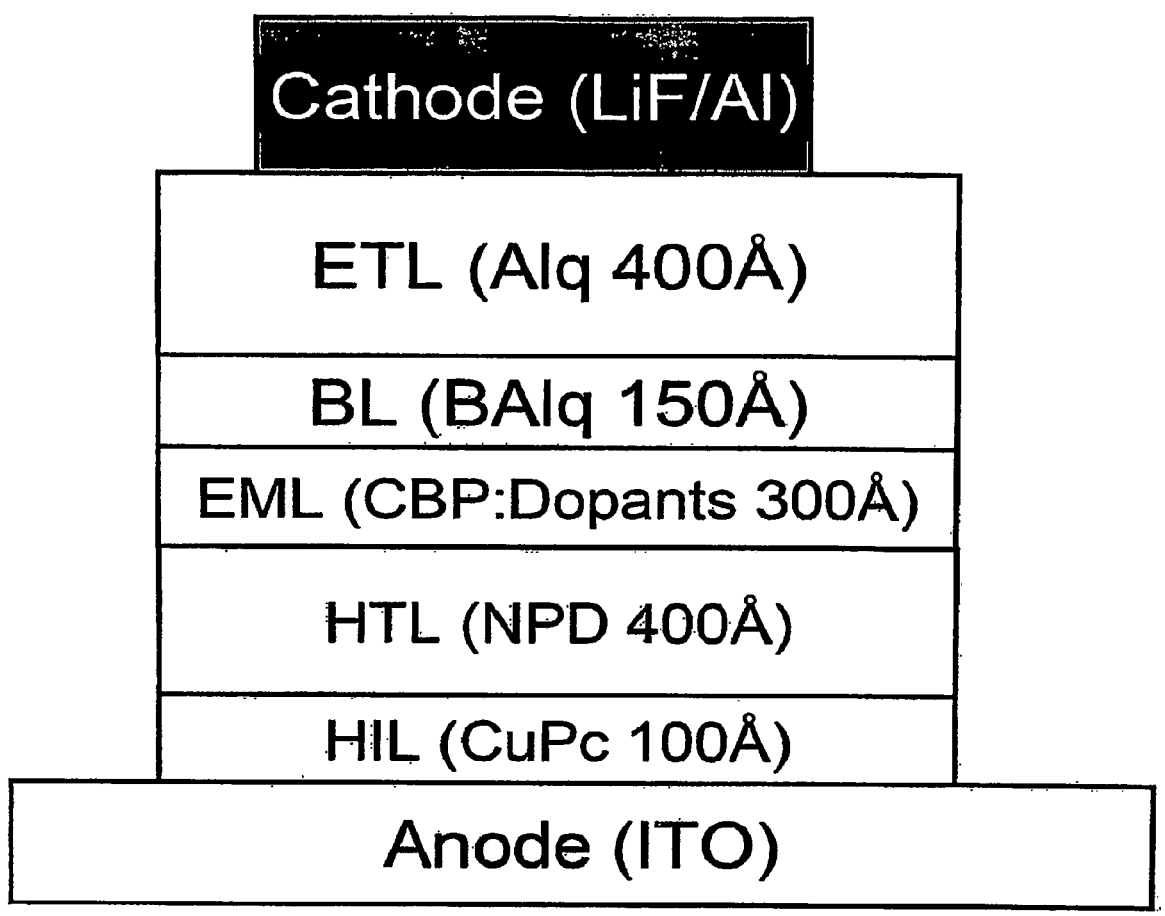
FIG. 10 illustrates the structure of the vapor deposited devices of Example 3 and Comparative Example 2.

A red emitting, vapor deposited device was prepared using the green phosphorescent dopant Green-2 as a non-emissive dopant and Red-2 as a phosphorescent red dopant in a CBP host. For comparison, a corresponding red emitting, single-doped device was prepared using Red-2 and a CBP host. The structure of the devices is illustrated in FIG. 10. The specific device structures of the device of Example 3, having the double-doped emissive layer, was as follows.

Example 3

ITO/CuPc/NPD/CBP:Green-2 (20%):Red-2(12%)/BAlq/Alq/LiF:Al

The specific device structures of the device of Comparative Example 2, having a single-doped emissive layer, was as follows.

Comparative Example 2

ITO/CuPc/NPD/CBP:Red-2(12%)/BAlq/Alq/LiF:Al

All of the layers of the devices of Example 3 and Comparative Example 2 were deposited using VTE, to provide a device having the structure illustrated in FIG. 10:
ITO(1200 Å)/CuPc(100 Å)/NPD(400 Å)/CBP:dopant(s) (300 Å)/Balq(150 Å)/Alq(400 Å)/LiF(10 Å)/Al(1000 Å).

The performance of each of the devices of Example 3 and Comparative Example 2 are set forth in Table 2.

TABLE 2

|  | Example 3 | Comparative Example 2 |
| --- | --- | --- |
| Emissive Red dopant, weight % | Red-2 12% | Red-2 12% |
| Non-emissive green dopant, weight % | Green-2 20% | — |
| CIE | 0.65, 0.35 | 0.65, 0.35 |
| Voltage*, V | 7.2 | 6.5 |
| Luminous Efficiency*, cd/A | 14.3 | 12.9 |
| E.Q.E.*, % | 13.1 | 12.2 |
| Power Efficiency*, lm/W | 6.3 | 6.2 |
| Relative luminance after 100 h at 40 mA/cm$^2$ lifetest, % | 94.40% | 89.90% |

*at 100 cd/m$^2$

Figure 11:
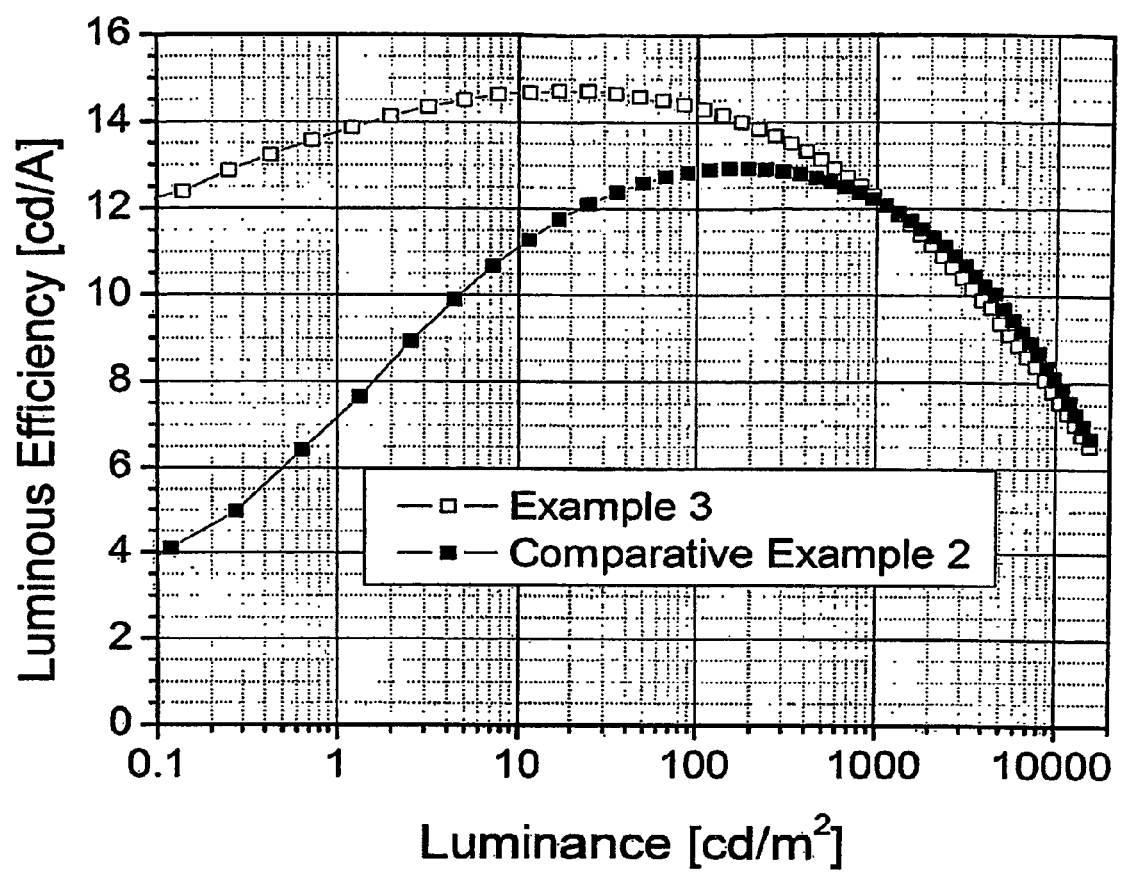
FIG. 11 illustrates a comparison of the luminous efficiency, as a function of luminance, of the devices of Example 3 and Comparative Example 2.
Figure 12:
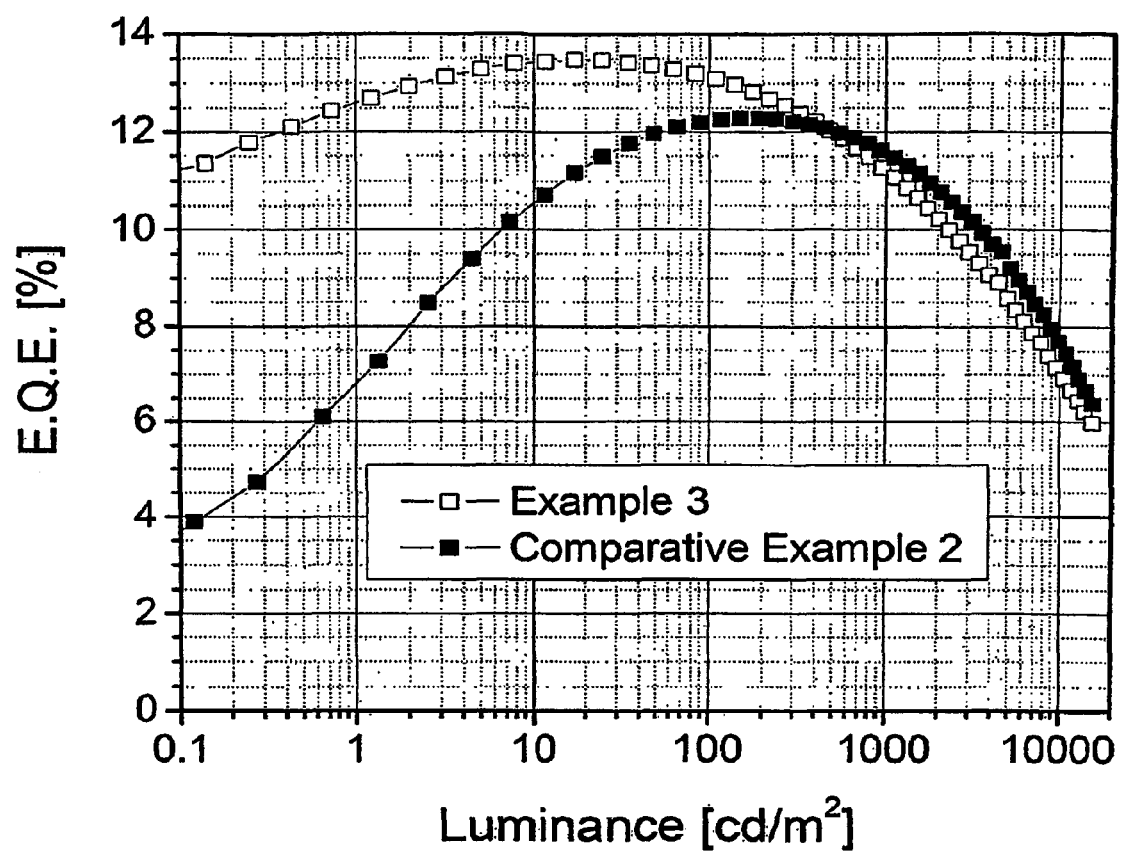
FIG. 12 illustrates a comparison of the external quantum efficiency, as a function of luminance, of the devices of Example 3 and Comparative Example 2.
Figure 13:
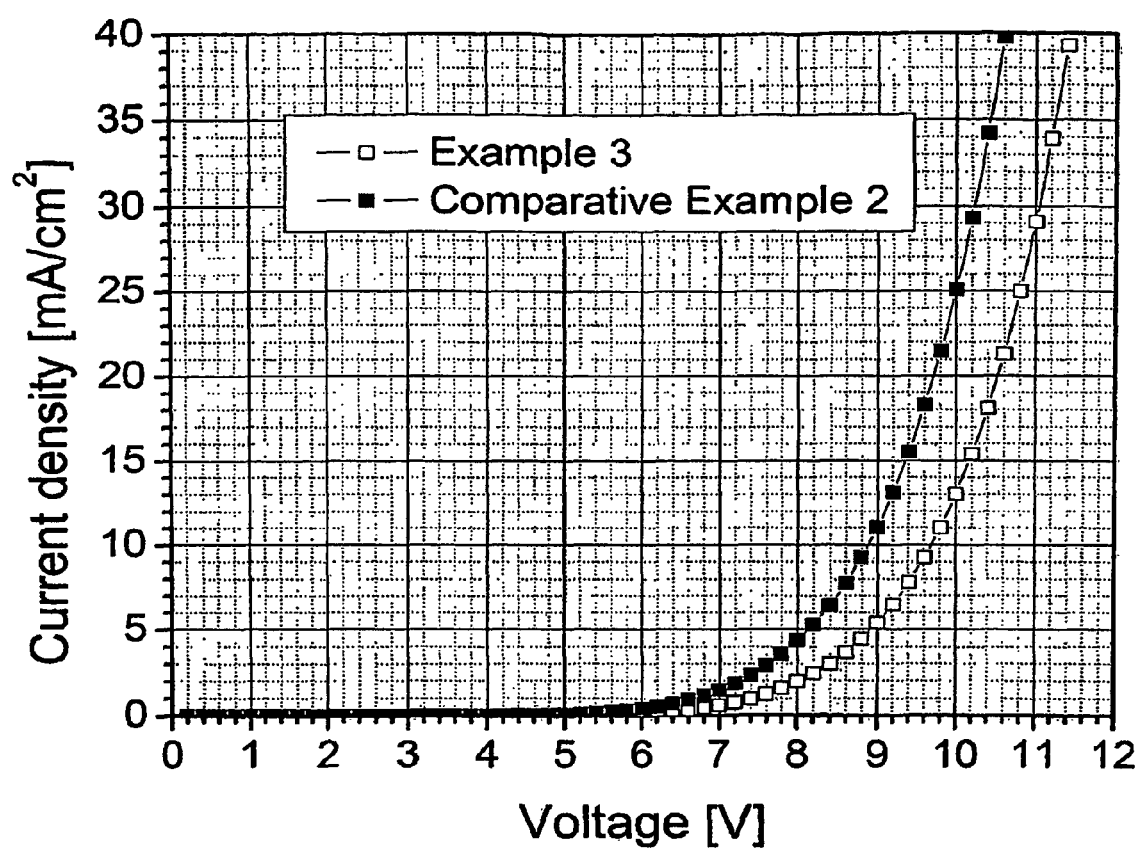
FIG. 13 illustrates a comparison of the current density, as a function of voltage, of the devices of Example 3 and Comparative Example 2.
Figure 14:
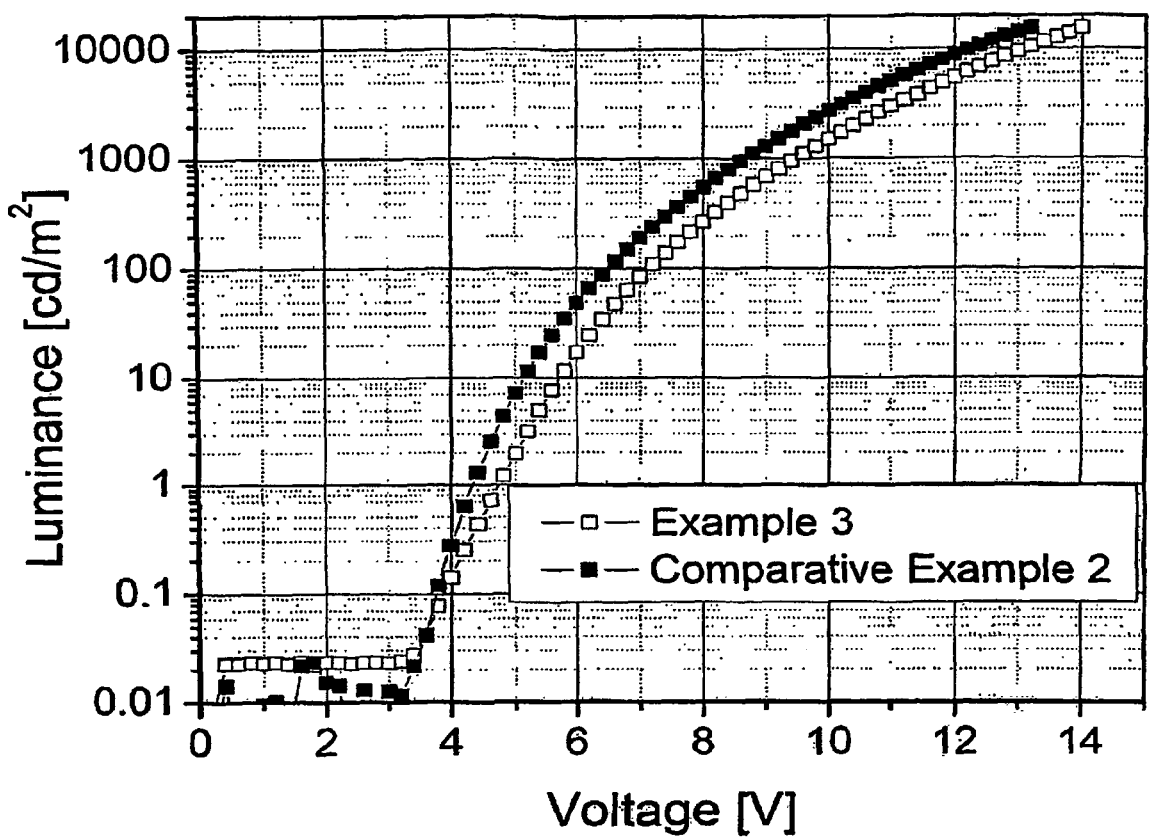
FIG. 14 illustrates a comparison of luminance, as a function of voltage, of the devices of Example 3 and Comparative Example 2.
Figure 16:
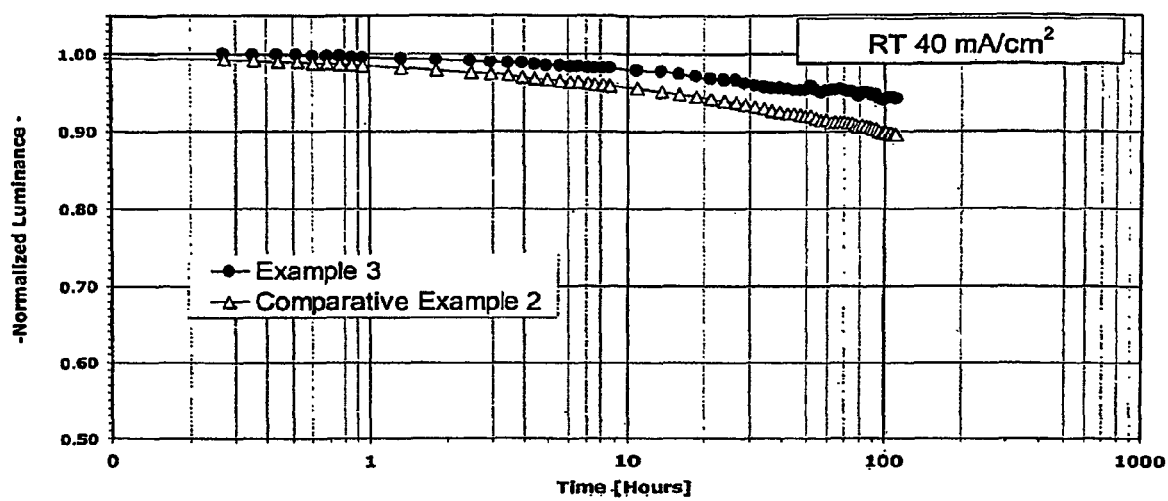
FIG. 16 illustrates a comparison of the lifetimes of the devices of Example 3 and Comparative Example 2.

The improved performance of VTE deposited multiple-doped devices in accordance with the invention is illustrated in FIGS. 11 to 14. FIG. 11 illustrates the luminous efficiency, as a function of luminance, FIG. 12 illustrates the external quantum efficiency, as a function of luminance, FIG. 13 illustrates the current density, as a function of voltage, and FIG. 14 illustrates the luminance, as a function of voltage, for each of the devices of Example 3 and Comparative Example 2. The limit of the improvement in performance observed in Example 2 is not observed in the device of Example 3, indicating that the amount of dopant that may provide an upper limit to the improved performance is not present in the device of Example 3. Moreover, as illustrated in FIG. 16, the lifetime of the multiple-doped device of Example 3 is clearly superior to that of the single-doped device of Comparative Example 2.

Figure 15:
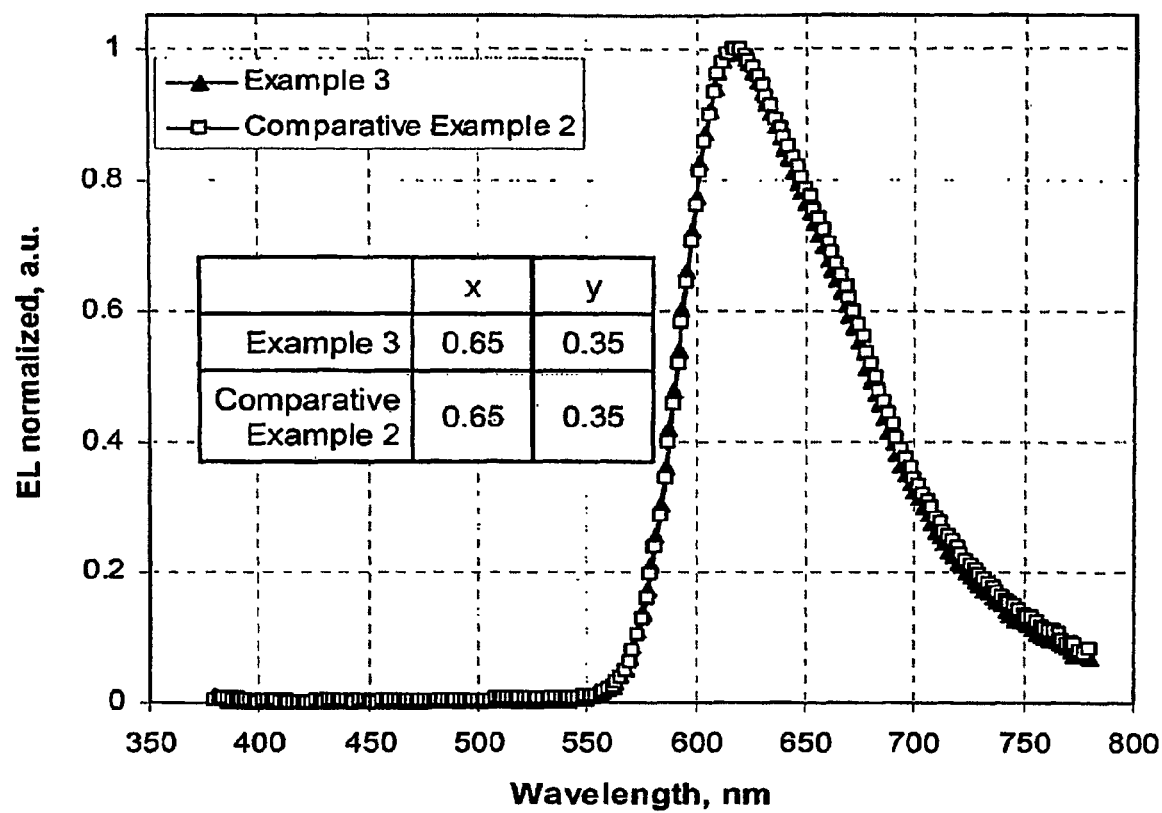
FIG. 15 illustrates a comparison of the electroluminescence spectra of the devices of Example 3 and Comparative Example 2.

FIG. 15 clearly demonstrates that the CIE coordinates and, thus, the color of the multiple-doped devices of Example 3 is substantially the same as those of the single-doped device of Comparative Example 2.

Figure 17:
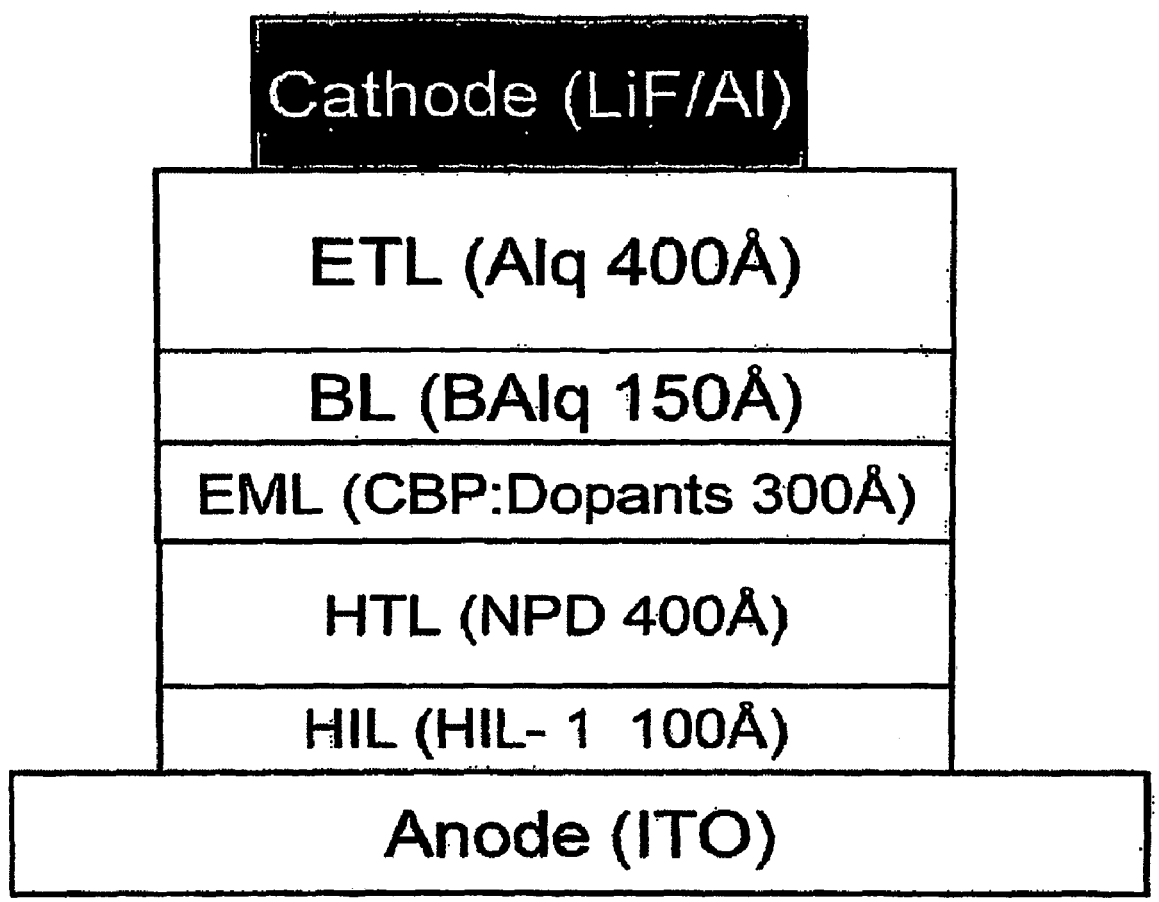
FIG. 17 illustrates the structure of the vapor deposited devices of Example 4 and Comparative Example 3.

A red emitting, vapor deposited device was prepared using the green phosphorescent dopant Green-2 as a non-emissive dopant and Red-3 as a phosphorescent red dopant in a CBP host. For comparison, a corresponding red emitting, single-doped device was prepared using Red-3 and a CBP host. The structure of the devices is illustrated in FIG. 17. The specific device structures of the device of Example 4, having the double-doped emissive layer, was as follows.

Example 4

ITO/HIL-1/NPD/CBP:Green-2(20%):Red-3(12%)/BAlq/Alq

The specific device structures of the device of Comparative Example 2, having a single-doped emissive layer, was as follows.

Comparative Example 3

ITO/HIL-1/NPD/CBP:Red-3(12%)/BAlq/Alq

All of the layers of the devices of Example 4 and Comparative Example 3 were deposited using VTE, to provide a device having the structure illustrated in FIG. 17:
ITO(1200 Å)/HIL-1(100 Å)/NPD(400 Å)/CBP:dopant(s) (300 Å)/Balq(150 Å)/Alq(400 Å)/LiF(10 Å)/Al(1000 Å).

The performance of each of the devices of Example 4 and Comparative Example 3 are set forth in Table 3.

TABLE 3

|  | Example 4 | Comparative Example 3 |
| --- | --- | --- |
| Emissive Red dopant, weight % | Red-3 12% | Red-3 12% |
| Non-emissive green dopant, weight % | Green-2 20% | — |
| CIE | 0.68, 0.32 | 0.67, 0.32 |
| Voltage*, V | 5.6 | 5.8 |
| Luminous Efficiency*, cd/A | 11.6 | 8.6 |
| E.Q.E.*, % | 15.5 | 11.3 |
| Power Efficiency*, lm/W | 6.5 | 4.7 |

*at 100 cd/m$^2$.

Figure 18:
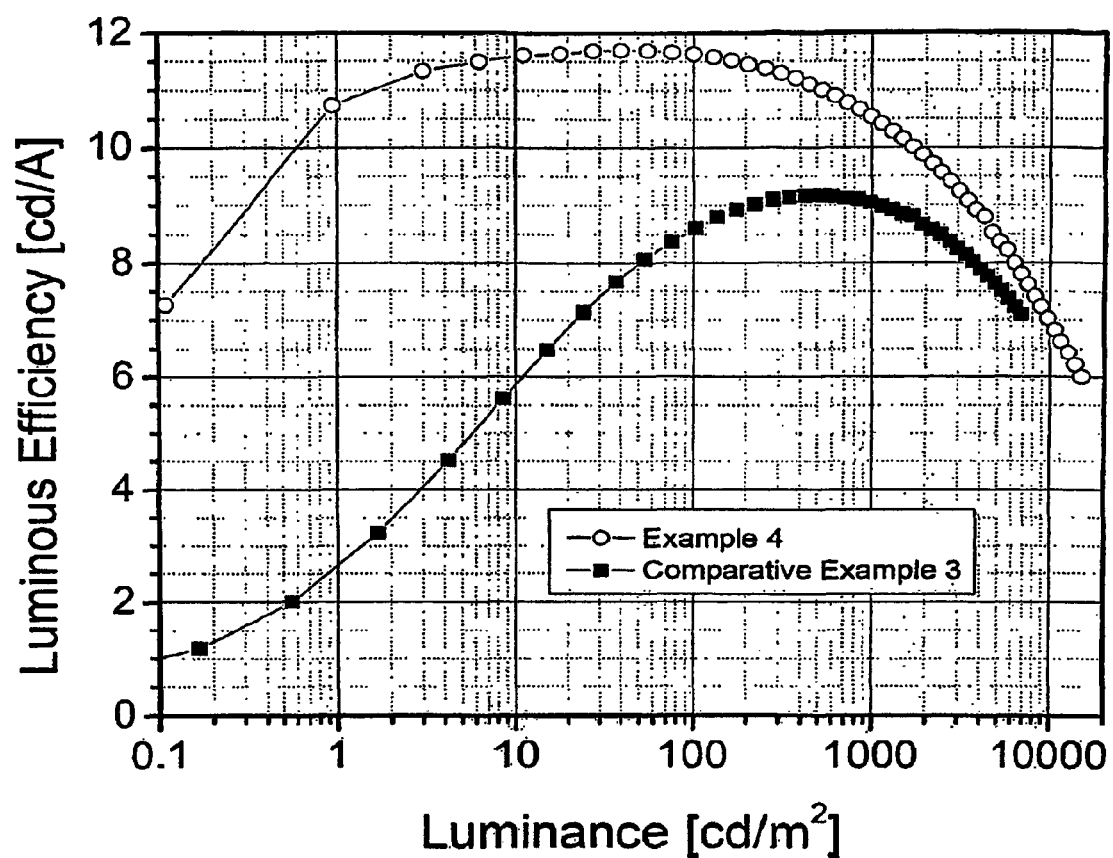
FIG. 18 illustrates a comparison of the luminous efficiency, as a function of luminance, of the devices of Example 4 and Comparative Example 3.
Figure 19:
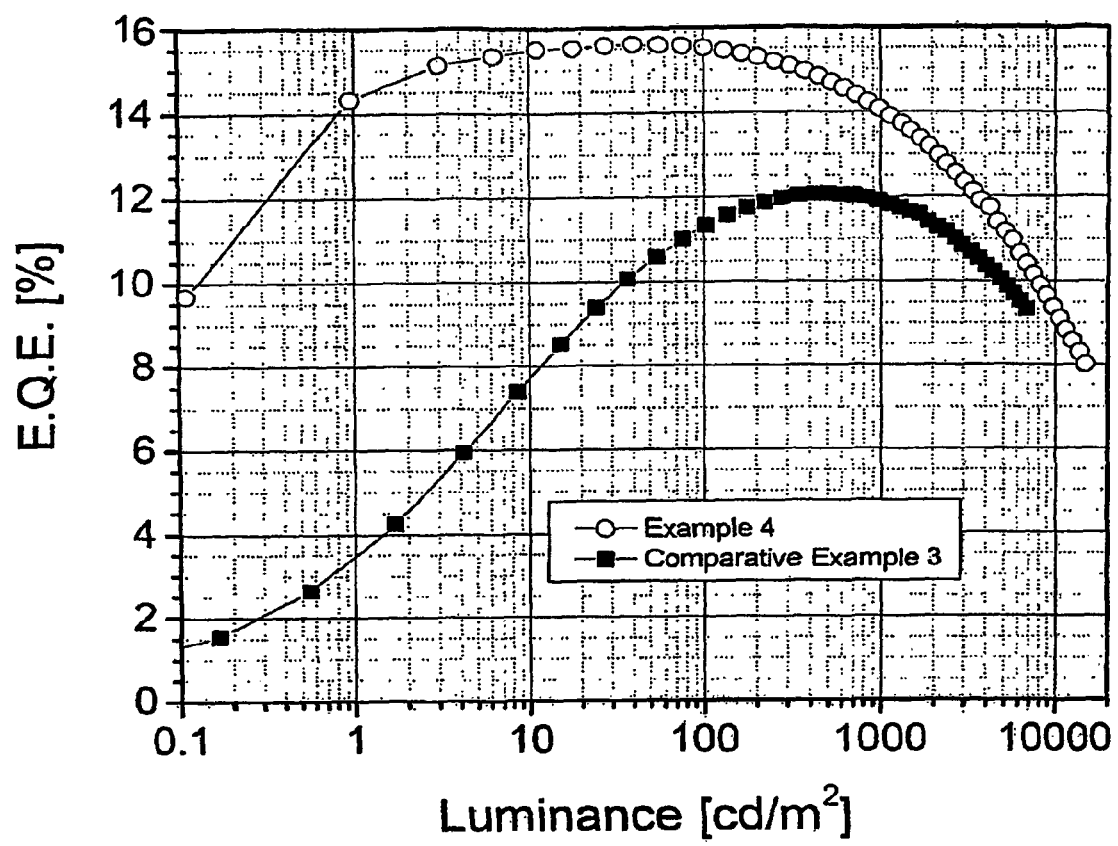
FIG. 19 illustrates a comparison of the external quantum efficiency, as a function of luminance, of the devices of Example 4 and Comparative Example 3.
Figure 20:
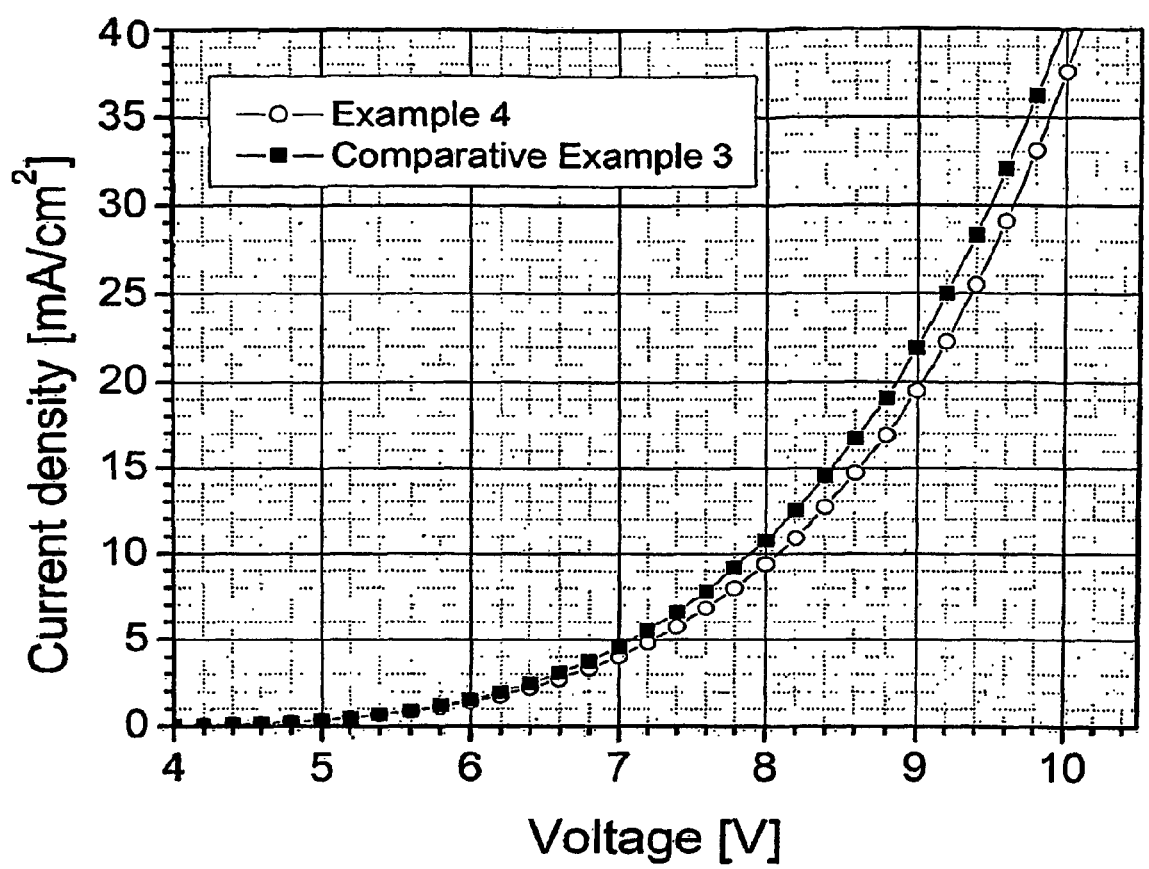
FIG. 20 illustrates a comparison of the current density, as a function of voltage, of the devices of Example 4 and Comparative Example 3.
Figure 21:
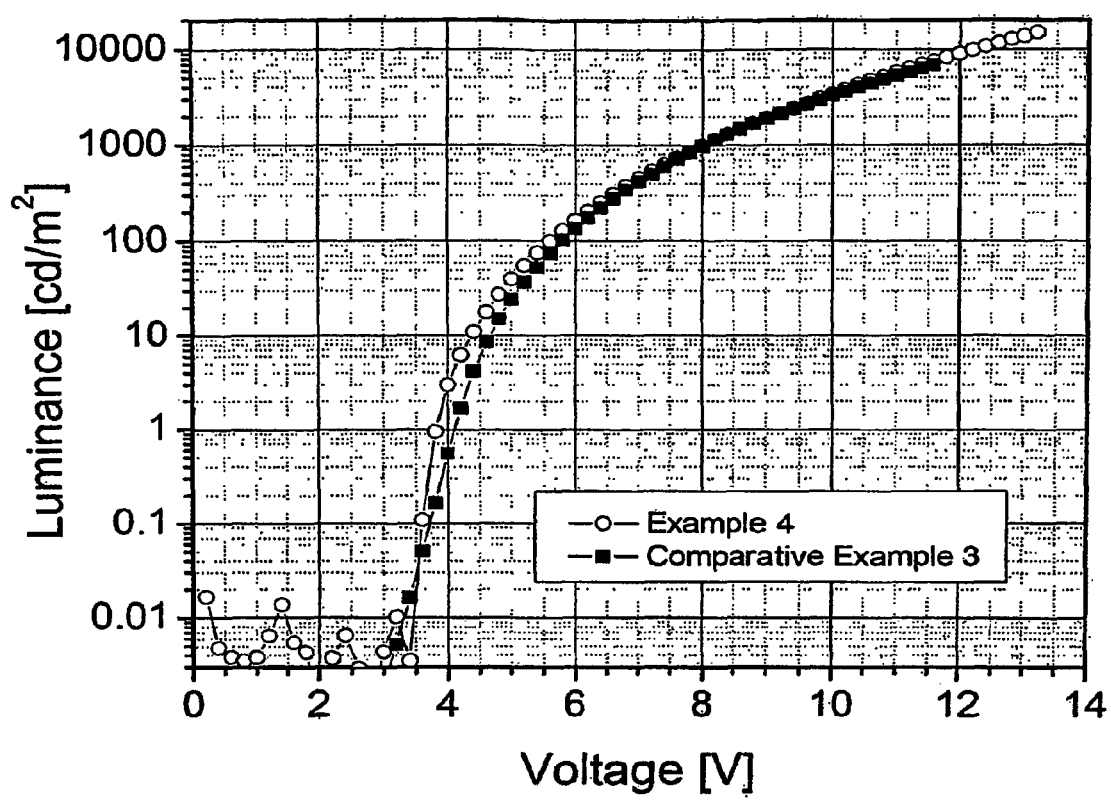
FIG. 21 illustrates a comparison of luminance, as a function of voltage, of the devices of Example 4 and Comparative Example 3.

The improved performance of VTE deposited multiple-doped devices in accordance with the invention is further illustrated in FIGS. 18 to 21. FIG. 18 illustrates the luminous efficiency, as a function of luminance, FIG. 19 illustrates the external quantum efficiency, as a function of luminance, FIG. 20 illustrates the current density, as a function of voltage, and FIG. 21 illustrates the luminance, as a function of voltage, for each of the devices of Example 4 and Comparative Example 3.

Figure 22:
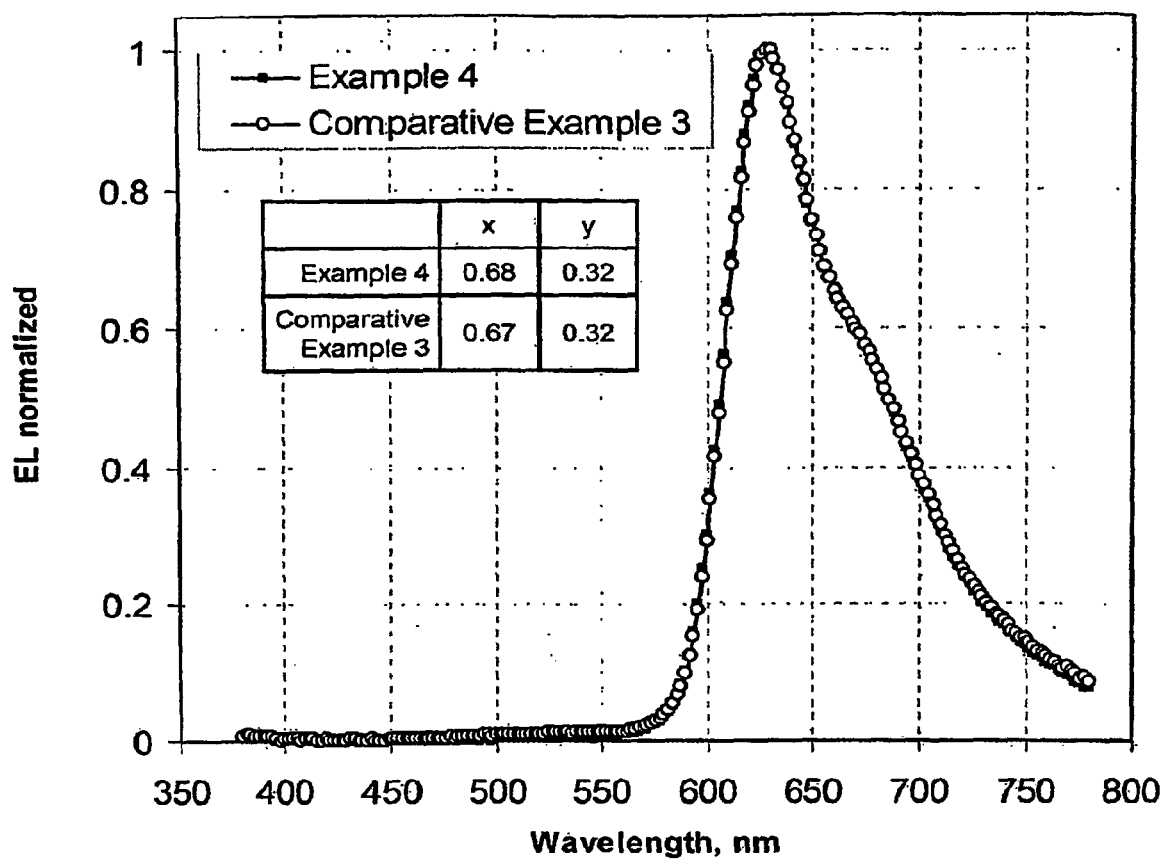
FIG. 22 illustrates a comparison of the electroluminescence spectra of the devices of Example 4 and Comparative Example 3.

FIG. 22 clearly demonstrates that the CIE coordinates and, thus, the color of the multiple-doped devices of Example 4 is substantially the same as those of the single-doped device of Comparative Example 3.

Figure 25:
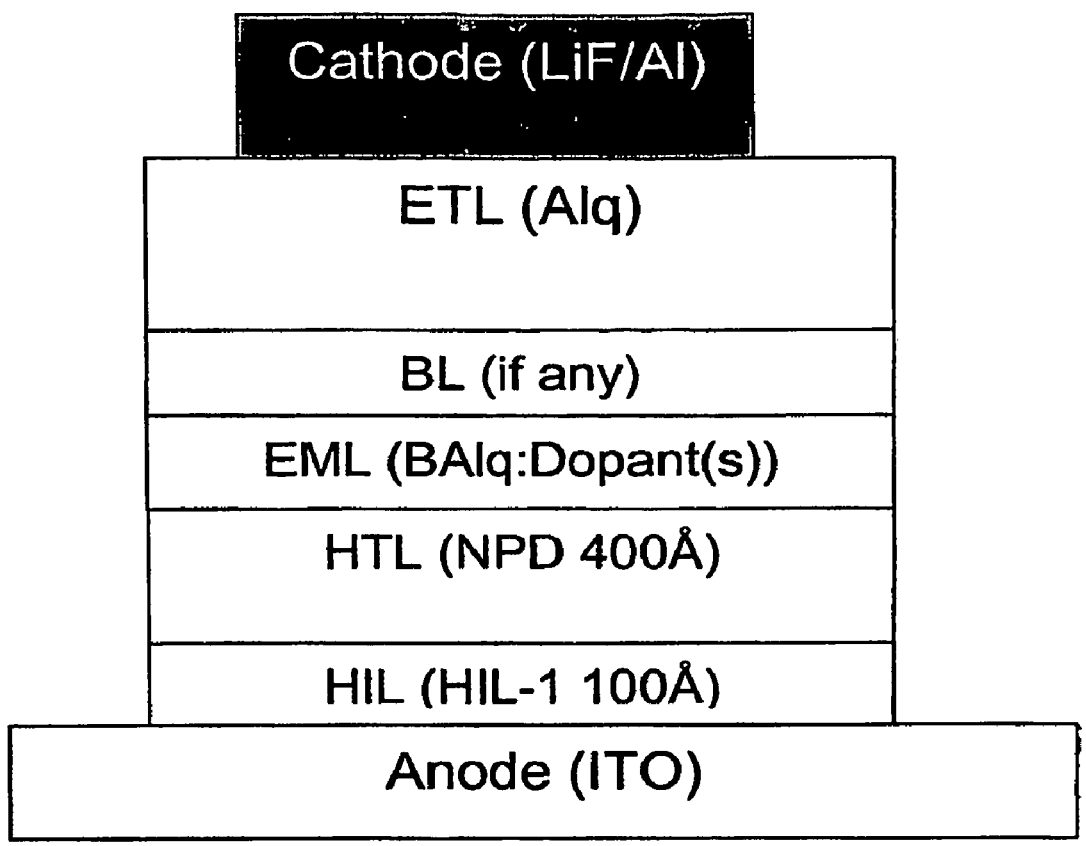
FIG. 25 illustrates the structures of the vapor deposited devices of Examples 5 to 11 and Comparative Examples 4 and 5.

Red emitting, vapor deposited OLEDs were prepared using the green phosphorescent dopant Green-2 as a non-emissive dopant and Red-2 as a phosphorescent red dopant in a BAlq host. For comparison, a corresponding red emitting, single-doped device was prepared using Red-2 and a BAN host. The structure of the devices is shown on FIG. 25. The specific device structures of the device of Example 5, 6, 7, 8, having the double-doped emissive layer, were as follows.

Examples 5, 6, 7, 8

ITO(1200 Å)/HIL-1(100 Å)/NPD(400 Å)/BAlq:Green-2 (x %):Red-2(y %)/BL(if any)/Alq/LiF:Al The specific device structure of the device of Comparative Example 4, having a single doped emissive layer, was as follows.

Comparative Example 4

ITO(1200 Å)/HIL-1(100 Å)/NPD(400 Å)/BAlq:Red-2(12%) (300 Å)/Alq(550 Å)/LiF:Al

All of the layers of the devices of Examples 5, 6, 7, and 8 and Comparative Example 4 were deposited using VTE. The performance of each of the devices of Example 5, 6, 7, and 8 and Comparative Example 4 are set forth in Table 4.

TABLE 4

The performance of the dual-doped and single-doped red BAlq host devices with Red-2 emitter.

|  | Example 5 | Example 6 | Example 7 | Example 8 | Comparative Example 4 |
|---|---|---|---|---|---|
| Red-2 [weight %] | 3 | 3 | 3 | 6 | 12 |
| Green-2 [weight %] | 10 | 20 | 10 | 5 | none |
| EML thickness [Å] | 300 | 300 | 300 | 400 | 300 |
| Blocking layer | HPT 50 Å | Balq 150 Å | Balq 150 Å | none | none |
| $Alq_3$ ETL thickness [Å] | 500 | 400 | 400 | 450 | 550 |
| CIE [X Y] | 0.65 0.35 | 0.64 0.35 | 0.65 0.35 | 0.65 0.35 | 0.65 0.35 |
| Voltage* [V] | 8.0 | 7.0 | 7.4 | 7.7 | 6.9 |
| Luminous Efficiency* [cd/A] | 21.2 | 21.2 | 21.8 | 19.0 | 15.2 |
| E.Q.E. [%] | 18.8 | 18.2 | 19.3 | 18.0 | 14.9 |
| Power Efficiency* [lm/W] | 9.5 | 9.3 | 9.3 | 7.7 | 6.9 |
| Initial Luminance at 40 mA/cm$^2$, [cd/m$^2$] | 6,647 | 7,103 | 6,890 | 5,854 | 4,840 |
| T80% at 40 mA/cm$^2$ [h] | 1,226 | 1,545 | 1,256 | 1,090 | 991 |

*at 500 nits

The improved performance of VTE deposited multiple-doped devices in accordance with the invention of Examples 5, 6, 7, and 8, as compared to the device of Comparative Example 4 are illustrated in the Table 4. The data demonstrates that the luminous efficiency and lifetime of the dual-doped devices are significantly superior to those characteristics in the single doped device.

Red emitting, vapor deposited OLEDs were prepared using the green phosphorescent dopant Green-2 as a non-emissive dopant and Red-3 as a phosphorescent red dopant in a BAlq host. For comparison, a corresponding red emitting, single-doped device was prepared using Red-3 and a BAlq host. The structure of the devices is shown on FIG. 25. The specific device structures of the devices of Example 9, 10, and 11, having the double-doped emissive layer, were as follows.

Examples 9, 10, 11

ITO(1200 Å)/HIL-1(100 Å)/NPD(400 Å)/BAlq:Green-2 (x %):Red-3(y %)/BL(if any)/Alq/LiF:Al The specific device structure of the device of Comparative Example 5, having a single-doped emissive layer, was as follows.

Comparative Example 5

ITO(1200 Å)/HIL-1(100 Å)/NPD(400 Å)/BAlq:Red-3(12%) (300 Å)/Alq(550 Å)/LiF:Al

All of the layers of the devices of Examples 9, 10, and 11 and Comparative Example 5 were deposited using VTE. The performance of each of the devices of Examples 9, 10, and 11 and Comparative Example 5 are set forth in Table 5.

TABLE 5

The performance of the dual-doped and single-doped red devices with Red-3 emitter.

|  | Example 9 | Example 10 | Example 11 | Comparative Example 5 |
|---|---|---|---|---|
| Red-3 [weight %] | 3 | 3 | 6 | 12 |
| Green-2 [weight %] | 10 | 20 | 5 | none |
| EML thickness [Å] | 300 | 300 | 400 | 300 |
| Blocking layer | HPT 50 Å | BAlq 150 Å | none | none |
| $Alq_3$ ETL thickness [Å] | 500 | 400 | 450 | 550 |
| CIE [X Y] | 0.67 0.32 | 0.67 0.33 | 0.68 0.32 | 0.68 0.32 |
| Voltage* [V] | 8.2 | 7.6 | 8.0 | 7.6 |
| Luminous Efficiency* [cd/A] | 14.1 | 14.9 | 12.4 | 10.7 |
| E.Q.E.* [%] | 17.5 | 17.6 | 16.8 | 15.5 |
| Power Efficiency* [lm/W] | 5.4 | 6.2 | 4.9 | 4.4 |
| Initial Luminance at 40 mA/cm$^2$, [cd/m$^2$] | 4,997 | 4,818 | 4,140 | 3,760 |
| T80% at 40 mA/cm$^2$ [h] | 1,975 | 1,582 | 2,250 | 2,000 |

*at 500 nits

The improved performance of VTE deposited multiple-doped devices in accordance with the invention of Examples 9, 10, and 11 and Comparative Example 5 is illustrated in the Table 5. The data demonstrates that the combination of luminous efficiency and lifetime of the dual-doped devices is significantly superior to those characteristics in the single doped device.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device, comprising an anode, a cathode, and an emissive layer, wherein the emissive layer is located between the anode and the cathode, an electron transport layer between the cathode and the emissive layer, and the emissive layer comprises:
    a host compound;
    a first compound capable of green or blue phosphorescent emission at room temperature; and
    a second compound capable of red phosphorescent emission at room temperature present in an amount of at least 3 weight %;
    wherein there is at least one voltage at which at least 95 percent of the emission from the device is produced from the second compound with a luminance of at least 10 cd/m$^2$, when the at least one voltage is applied across the anode and the cathode.

2. The organic light emitting device of claim 1, wherein the first compound is a charge carrying compound.

3. The organic light emitting device of claim 1, wherein the first compound is an electron carrying compound.

4. The organic light emitting device of claim 1, wherein the first compound is a hole carrying compound.

5. The organic light emitting device of claim 1, wherein the device has a CIE that is substantially the same as that of a second device, wherein the second device differs from the device only in that the second device has an emissive layer that does not contain the first compound.

6. The organic light emitting device of claim 1, wherein the device has an external quantum efficiency greater than that of a second device, wherein the second device differs from the device only in that the second device has an emissive layer that does not contain the first compound.

7. The organic light emitting device of claim 6, wherein the second device has a doping percentage of the second compound equivalent to that of the second compound of the device.

8. The organic light emitting device of claim 1, wherein the device has a lifetime greater than that of a second device, wherein the second device differs from the device only in that the second device has an emissive layer that does not contain the first compound.

9. The organic light emitting device of claim 8, wherein the lifetime of the device is at least 3 times that of the second device.

10. The organic light emitting device of claim 8, wherein the lifetime of the device is from about 3 to about 4 times that of the second device.

11. The organic light emitting device of claim 1, wherein the first compound is present in an amount of from about 3.5 to about 40 mole percent, based on the emissive layer.

12. The organic light emitting device of claim 1, wherein the first compound is present in an amount of about 15 mole percent, based on the emissive layer.

13. The organic light emitting device of claim 1, wherein at least 99 percent of emission from the device is produced from the second compound when the at least one voltage is applied across the anode and cathode.

14. The organic light emitting device of claim 1, wherein substantially all emission from the device is produced from the second compound when the at least one voltage is applied across the anode and cathode.

15. The organic light emitting device of claim 1, wherein, when the first compound emits, the emission is a green phosphorescent emission.

16. The organic light emitting device of claim 1, wherein, when the first compound emits, the emission is a blue phosphorescent emission.

17. The organic light emitting device of claim 1, wherein at least one of the first and second compounds is an organometallic compound.

18. The organic light emitting device of claim 1, wherein the first compound is Iridium(III)tris[2-(biphenyl-3-yl)-4-tert-butylpyridine], and the second compound is Bis[5-Phenyl-3'-methyl(2-phenylquinoline)]iridium(III) acetylacetonate.

19. The organic light emitting device of claim 1, wherein the first compound is Iridium(III)tris(3-methyl-2-phenylpyridine), and the second compound is Bis[3'-methyl(2-phenylquinoline)]iridium(III) acetylacetonate.

20. The organic light emitting device of claim 1, wherein the first compound has a HOMO level between the HOMO level of the host and the HOMO level of the second compound.

21. The organic light emitting device of claim 1, wherein the first compound has a LUMO level between the LUMO level of the host and the LUMO level of the second compound.

22. A process for making the organic light emitting device of claim 1, comprising solution depositing the emissive layer.

23. A process for making the organic light emitting device of claim 1, comprising vapor depositing the emissive layer.

24. A method for producing light emission from an organic light emitting device, comprising:
    obtaining an organic light emitting device comprising an anode, a cathode, and an emissive layer, wherein the emissive layer is located between the anode and the cathode, an electron transport layer between the cathode and the emissive layer, and the emissive layer comprises:
    a host compound;
    a first compound capable of green or blue phosphorescent emission at room temperature; and
    a second compound capable of red phosphorescent emission at room temperature present in an amount of at least 3 weight %; and
    applying a voltage across the anode and the cathode sufficient to produce emission with a luminance of at least 10 cd/m$^2$ from the device, wherein at least 95 percent of the emission is produced from the second compound.

25. The organic light emitting device of claim 1, wherein the device lacks a blocking layer between the emissive layer and the electron transport layer.

26. The method of claim 24, wherein the device lacks a blocking layer between the emissive layer and the electron transport layer.

* * * * *